US012666808B2

(12) United States Patent
    Kim et al.

(10) Patent No.:    US 12,666,808 B2
(45) Date of Patent:      Jun. 23, 2026

(54) LIGHT EMITTING DISPLAY DEVICE WITH SUBPIXELS HAVING DIFFERENT STRUCTURES

(71) Applicant: LG Display Co., Ltd., Seoul (KR)

(72) Inventors: Bo Seong Kim, Paju-si (KR); Min Chul Jun, Paju-si (KR); Dong Cheol Choe, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 284 days.

(21) Appl. No.: 18/359,190

(22) Filed: Jul. 26, 2023

(65) Prior Publication Data

US 2024/0215321 A1    Jun. 27, 2024

(30) Foreign Application Priority Data

Dec. 22, 2022    (KR) ........................ 10-2022-0182245

(51) Int. Cl.
    *H10K 59/32*        (2023.01)
    *H10K 50/16*        (2023.01)
    *H10K 50/18*        (2023.01)
    *H10K 59/122*       (2023.01)

(52) U.S. Cl.
    CPC ........... *H10K 59/122* (2023.02); *H10K 50/16* (2023.02); *H10K 50/181* (2023.02); *H10K 59/32* (2023.02)

(58) Field of Classification Search
    CPC .... H10K 59/122; H10K 50/16; H10K 50/181; H10K 59/32; H10K 2102/351; H10K 50/00; H10K 50/131; H10K 50/19; H10K 59/35; H10K 59/12; H10K 59/351; H10K 59/352; H10K 59/353; H10K 50/13; H10K 50/12; H10K 50/15; H10K 50/17; H10K 50/18; H10K 50/81; H10K 50/82
    See application file for complete search history.

(56)                 References Cited

U.S. PATENT DOCUMENTS

| | | | |
|---|---|---|---|
| 2013/0140533 A1 | 6/2013 | Lee et al. | |
| 2014/0183464 A1 | 7/2014 | Baek et al. | |
| 2016/0293676 A1* | 10/2016 | Komatsu | H10K 71/135 |
| 2020/0006692 A1 | 1/2020 | Seok et al. | |
| 2020/0212129 A1 | 7/2020 | Jeong | |
| 2021/0151518 A1 | 5/2021 | Park et al. | |
| 2021/0193747 A1 | 6/2021 | Hack et al. | |
| 2022/0093689 A1* | 3/2022 | Kwak | H10K 50/115 |

(Continued)

FOREIGN PATENT DOCUMENTS

| | | |
|---|---|---|
| CN | 11114569 A | 5/2020 |
| JP | 2012-504852 A | 2/2012 |
| JP | WO2015/072143 A1 | 5/2015 |

(Continued)

*Primary Examiner* — Donald L Raleigh
(74) *Attorney, Agent, or Firm* — Birch, Stewart, Kolasch & Birch, LLP

(57)                 ABSTRACT

A light emitting display device including a bank exposing first to fourth light emitting portions on a substrate; first to fourth anodes respectively disposed on one of the first to fourth light emitting portions; first light emitting stacks on the first to fourth anodes; a charge generation layer on the first light emitting stack in the fourth light emitting portion; a second light emitting stack on the charge generation layer in the fourth light emitting portion; and a cathode on the first light emitting stack and the second light emitting stack.

20 Claims, 12 Drawing Sheets

(56) References Cited

U.S. PATENT DOCUMENTS

2022/0208876 A1    6/2022  Park et al.

FOREIGN PATENT DOCUMENTS

| JP | WO2015/178029 A1 | 11/2015 |
|----|------------------|---------|
| JP | 6291698 B2 | 3/2018 |
| JP | 2018-133242 A | 8/2018 |
| JP | 2020-4970 A | 1/2020 |
| KR | 10-2011-0057234 A | 5/2011 |
| KR | 10-2020-0001414 A | 1/2020 |
| KR | 10-2020-0082762 A | 7/2020 |
| KR | 10-2280013 B1 | 7/2021 |
| KR | 10-2022-0072933 A | 6/2022 |
| KR | 10-2408906 B1 | 6/2022 |
| KR | 10-2022-0092168 A | 7/2022 |
| TW | 201428994 A | 7/2014 |
| TW | 202111085 A | 3/2021 |
| WO | WO 2022/003353 A1 | 1/2022 |
| WO | WO 2022/185149 A1 | 9/2022 |

* cited by examiner

LIGHT EMITTING DISPLAY DEVICE WITH SUBPIXELS HAVING DIFFERENT STRUCTURES

CROSS-REFERENCE TO RELATED APPLICATION

This application claims the benefit under 35 U.S.C. § 119(a) to Patent Application No. 10-2022-0182245, filed in the Republic of Korea on Dec. 22, 2022, which is hereby incorporated by reference into the present application.

BACKGROUND OF THE INVENTION

Field of the Invention

The present disclosure relates to a display device, and more particularly to a light emitting display device with an increased lifespan, a reduced color coordinate change due to a viewing angle change, and an improved color gamut.

Discussion of the Related Art

Various display devices having excellent performance, such as slimness, light weight, and low power consumption, have been developed. Among the display devices, a light emitting display device without a separate light source has been developed.

Further, a light emitting element includes including the display device includes an anode and a cathode and a light emitting portion provided between the anode and the cathode. In addition, the light emitting element may include a common layer that transports holes and electrons to the light emitting portion.

Meanwhile, the light emitting element uses light emitting materials that emit light having different wavelengths for color expression, and wavelength-specific light emitting materials are different from each other in terms of efficiency and lifespan.

SUMMARY OF THE INVENTION

It is an object of the present invention to provide a display device with a light emitting element, whereby lifespan of the light emitting display device is increased.

It is an object of the present invention to provide a display device with a light emitting element, whereby color coordinate change of the light emitting display device due to viewing angle change is reduced.

It is an object of the present invention to provide a display device with a light emitting element, whereby color gamut of the light emitting display device is improved.

It is an object of the present invention to provide a display device with a light emitting element having a changed structure.

Among light emitting materials, a light emitting material that emits light having a short wavelength close to an ultraviolet wavelength has a lifespan and efficiency that are inversely proportional to a lifespan and efficiency of a long-wavelength dopant.

Consequently, the present disclosure provides a light emitting display device having an improved lifespan and efficiency, wherein a subpixel including a long-wavelength light emitting layer and a subpixel including a short-wavelength light emitting layer are configured to have different structures. Thus, both the lifespan and efficiency of an element using a light emitting layer including a short-wavelength light emitting material are improved.

A light emitting display device according to an embodiment of the present disclosure includes a bank exposing first to fourth light emitting portions on a substrate, first to fourth anodes respectively disposed on one of the first to fourth light emitting portions, first light emitting stacks on the first to fourth anodes, a charge generation layer and a second light emitting stack on the first light emitting stack to correspond to the fourth light emitting portion, and a cathode on the first light emitting stack of the first to third light emitting portions and the second light emitting stack of the fourth light emitting portion.

The first light emitting stack in the first light emitting portion may include a red light emitting layer. The first light emitting stack in the second light emitting portion may include a green light emitting layer. The first light emitting stack in the third light emitting portion may include a blue light emitting layer. The first light emitting stack in the fourth light emitting portion may include a first blue light emitting layer at a same layer at the blue light emitting layer in the first light emitting stack. The second light emitting stack in the fourth light emitting portion may include a second blue light emitting layer.

The third anode and the fourth anode may be integrally formed. The third anode and the fourth anode may be provided in the same layer. The third anode and the fourth anode may be connected to each other.

A first common layer may be located between the first to fourth anodes and the first light emitting stacks. A second common layer may be located on the red light emitting layer, the green light emitting layer, the blue light emitting layer, and the first blue light emitting layer. An electron blocking layer may be located between the first common layer and the red light emitting layer, the green light emitting layer, the blue light emitting layer, and the first blue light emitting layer.

The second light emitting stack in the fourth light emitting portion may further comprise a hole transport layer between the charge generation layer and the second blue light emitting layer, and an electron transport layer between the second blue light emitting layer and the cathode.

The electron transport layer may contact the second common layer on the bank between the third light emitting portion and the fourth light emitting portion.

The first common layer may comprise at least one of a hole injection layer, a hole transport layer, and an electron blocking layer. The first light emitting portion and the second light emitting portion may further comprise at least one a hole transport auxiliary layer between first common layer and the electron blocking layer.

The first light emitting stack at the first light emitting portion may have a larger thickness than the first light emitting stack at the second light emitting portion. The first light emitting stack at the third light emitting portion and the fourth light emitting portion may have a smaller thickness than the first light emitting stack at the first light emitting portion and the second light emitting portion.

At least one of the blue light emitting layer in the third light emitting portion and the first blue light emitting layer in the fourth light emitting portion may comprise a fluorescent dopant. The second blue light emitting layer of the second light emitting stack may comprise a non-fluorescent dopant.

The non-fluorescent dopant may be a phosphorescent dopant or a thermally activated delayed fluorescent (TADF) dopant.

A sum of an area of the third light emitting portion and an area of the fourth light emitting portion may be greater than an area of each of the first light emitting portion and the second light emitting portion. A ratio in an area of the third light emitting portion to an area of the fourth light emitting portion may be 1:10 to 10:1.

A light emitting display device according to another embodiment of the present disclosure includes a bank exposing first to fourth light emitting portions, first to fourth anodes respectively disposed on one of the first to fourth light emitting portions, a first light emitting layer on the first anode, a second light emitting layer on the second anode, a third light emitting layer on both the third anode and the fourth anode, a charge generation layer and a fourth light emitting layer stacked one on the other on the third light emitting layer in the fourth light emitting portion, the charge generation layer and the fourth light emitting layer exposing the third light emitting portion, and a cathode on the first light emitting layer, the second light emitting layer, and the third light emitting layer in the first to third light emitting portions and the fourth light emitting layer in the fourth light emitting portion.

Each of the third light emitting layer and the fourth light emitting layer may have an emission peak at a wavelength in a range of 420 nm to 490 nm.

One of the third light emitting layer and the fourth light emitting layer may comprise a fluorescent dopant. The other of the third light emitting layer and the fourth light emitting layer may comprise a non-fluorescent dopant.

A first common layer may be located between the first to fourth anodes and the first to third light emitting layers. A second common layer may be located between the first to third light emitting layers and the cathode. An electron transport layer may be between the fourth light emitting layer and the cathode.

A lower surface of the cathode may contact the second common layer in the first to third light emitting portions. The lower surface of the cathode may contact the electron transport layer in the fourth light emitting portion.

A light emitting display device according to further another embodiment of the present disclosure includes a substrate; a first anode on the substrate in a first light emitting portion; a second anode on the substrate in a second light emitting portion; a third anode on the substrate in a third light emitting portion; a fourth anode on the substrate in a fourth light emitting portion; a first common layer commonly provided on the first anode, the second anode, the third anode and the fourth anode; a first light emitting layer in the first light emitting portion on the first common layer; a second light emitting layer in the second light emitting portion on the first common layer; a third light emitting layer in the third and fourth light emitting portions on the first common layer; a second common layer commonly provided on the first light emitting layer, the second light emitting layer and the third light emitting layer; a charge generation layer on the third light emitting layer in the fourth light emitting portion on the second common layer; a fourth light emitting layer on the charge generation layer in the fourth light emitting portion; and a cathode on the second common layer in the first, second and third light emitting portion and on the fourth light emitting layer in the fourth light emitting portion.

The first light emitting layer may include a red light emitting layer. The second light emitting layer may include a green light emitting layer. The third light emitting layer may include a first blue light emitting layer. The fourth light emitting layer may include a second blue light emitting layer. The first blue light emitting layer and the second blue light emitting layer may be made of different materials. The first blue light emitting layer and the second blue light emitting layer may be configured to emit at different wavelengths.

The third anode and the fourth anode may be arranged in the same layer. The third anode and the fourth anode may be in the same horizontal plane. The third anode and the fourth anode may be integrally formed. The third anode and the fourth anode may be connected to each other.

A hole transport layer may be located on the charge generation layer in the fourth light emitting portion. The second blue light emitting layer may be disposed on the hole transport layer. An electron transport layer may be provided on the second blue light emitting layer.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
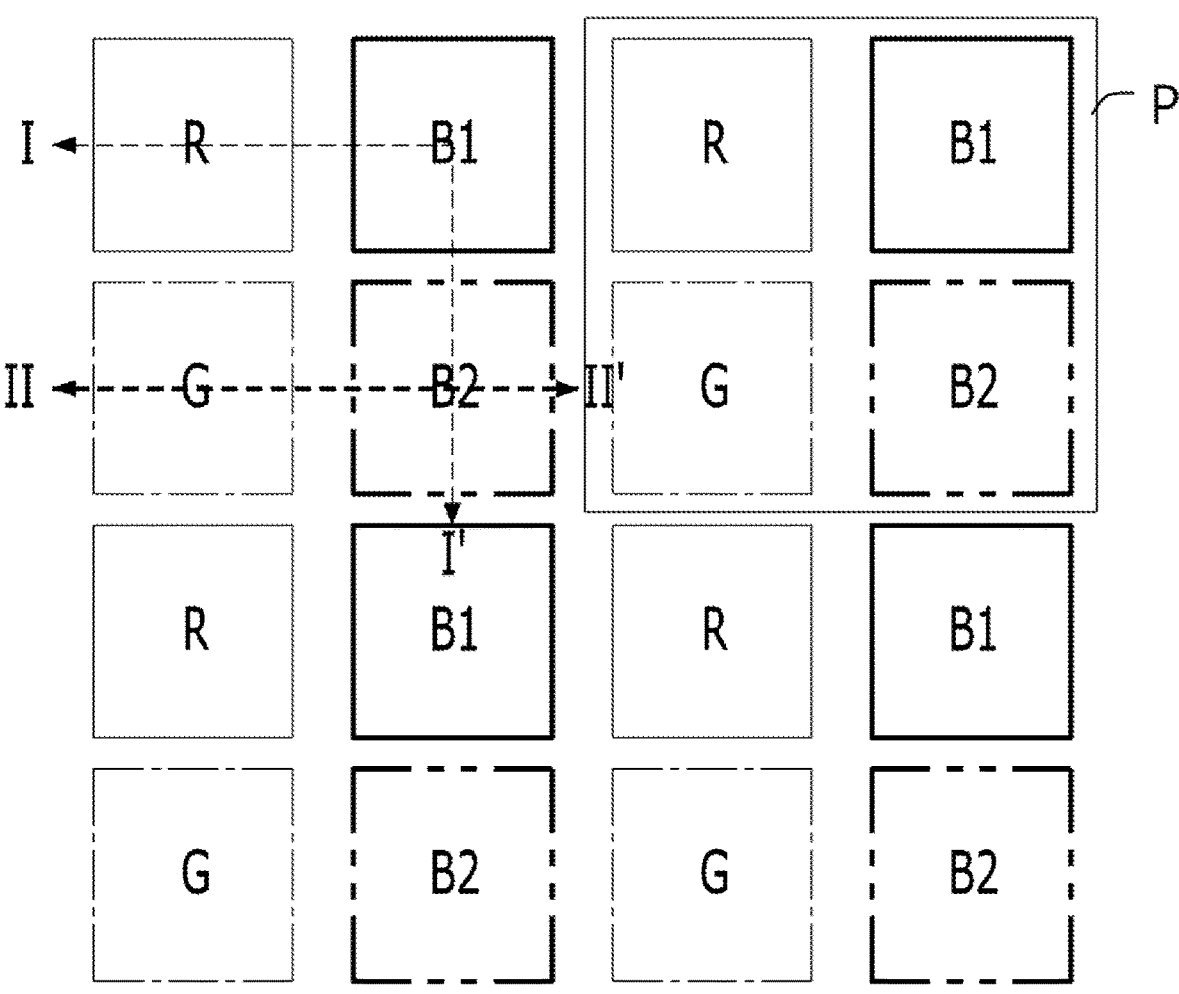
FIG. 1 is a plan view showing a light emitting display device according to an embodiment of the present disclosure.

Reference will now be made in detail to example embodiments of the present disclosure, examples of which are illustrated in the accompanying drawings. Wherever possible, the same reference numbers will be used throughout the drawings to refer to the same or like parts, unless otherwise specified.

Advantages and features of the present disclosure, and a method of achieving the advantages and features will become apparent with reference to the example embodiments described herein in detail together with the accompanying drawings. The present disclosure should not be construed as limited to the example embodiments as disclosed below, and may be embodied in various different forms. Thus, these example embodiments are set forth only to make the present disclosure sufficiently complete, and to assist those skilled in the art to fully understand the scope of the present disclosure. The protected scope of the present disclosure is defined by the claims and their equivalents.

In the following description of the present disclosure, where the detailed description of the relevant known steps, elements, functions, technologies, and configurations may unnecessarily obscure an important point of the present disclosure, a detailed description of such steps, elements, functions, technologies, and configurations may be omitted. In addition, the names of elements used in the following description are selected in consideration of clarity of description of the specification, and may differ from the names of elements of actual products. Furthermore, in the following detailed description of the present disclosure, numerous specific details are set forth in order to provide a sufficiently thorough understanding of the present disclosure. However, it will be understood that the present disclosure may be practiced without these specific details. In other instances, known methods, procedures, components, and circuits have not been described in detail so as not to unnecessarily obscure aspects of the present disclosure.

The shapes, sizes, ratios, angles, numbers, and the like, which are illustrated in the drawings to describe various example embodiments of the present disclosure are merely given by way of example. The disclosure is not limited to the illustrations in the drawings.

In the present specification, where terms such as "including," "having," "comprising," and the like are used, one or more components may be added, unless the term, such as "only," is used. As used herein, the term "and/or" includes a single associated listed item and any and all of the combinations of two or more of the associated listed items.

An expression such as "at least one of" when preceding a list of elements may modify the entire list of elements and may not modify the individual elements of the list. The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The terminology used herein is to describe particular aspects and is not intended to limit the present disclosure. As used herein, the terms "a" and "an" used to describe an element in the singular form is intended to include a plurality of elements. An element described in the singular form is intended to include a plurality of elements, and vice versa, unless the context clearly indicates otherwise.

In construing a component or numerical value, the component or the numerical value is to be construed as including an error or tolerance range even where no explicit description of such an error or tolerance range is provided.

In describing the various example embodiments of the present disclosure, where the positional relationship between two elements is described using terms, such as "on", "above", "under" and "next to", at least one intervening element may be present between the two elements, unless "immediate(ly)" or "direct(ly)" or "close(ly) is used. It will be understood that when an element or layer is referred to as being "connected to", or "coupled to" another element or layer, it may be directly connected to or coupled to the other element or layer, or one or more intervening elements or layers may be present.

In describing the various example embodiments of the present disclosure, when terms such as "after," "subsequently," "next," and "before," are used to describe the temporal relationship between two events, another event may occur therebetween, unless a more limiting term, such as "just," "immediate(ly)," or "directly" is used.

In describing the various example embodiments of the present disclosure, terms such as "first" and "second" may be used to describe a variety of components. These terms aim to distinguish the same or similar components from one another and do not limit the components. Accordingly, throughout the specification, a "first" component may be the same as a "second" component within the technical concept of the present disclosure, unless specifically mentioned otherwise.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

As used herein, the term "doped" layer refers to a layer including a first material and a second material (for example, n-type and p-type materials, or organic and inorganic substances) having physical properties different from the first material. Apart from the differences in properties, the first and second materials may also differ in terms of their amounts in the doped layer. For example, the host material may be a major component while the dopant material may be a minor component. The first material accounts for most of the weight of the doped layer. The second material may be added in an amount less than 30% by weight, based on a total weight of the first material in the doped layer. A "doped" layer may be a layer that is used to distinguish a host material from a dopant material of a certain layer, in consideration of the weight ratio. For example, if all of the materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered to be a "doped" layer.

Also, the term "undoped" refers to layers that are not "doped". For example, a layer may be an "undoped" layer when the layer contains a single material or a mixture including materials having the same properties as each other. For example, if at least one of the materials constituting a certain layer is p-type and none of the materials constituting the layer are n-type, the layer is considered to be an "undoped" layer. For example, if at least one of the materials constituting a layer is an organic material and none of the materials constituting the layer are inorganic materials, the layer is considered to be an "undoped" layer.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In this present disclosure, an electroluminescence (EL) spectrum may be calculated by multiplying (a) a photoluminescence (PL) spectrum, which applies the inherent characteristics of an emissive material such as a dopant material or a host material included in an organic emission layer, by (b) an outcoupling or emittance spectrum curve, which is determined by the structure and optical characteristics of an organic light-emitting element including the thicknesses of organic layers such as, for example, an electron transport layer.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale in which each of elements is illustrated in the accompanying drawings may differ from an actual scale. Thus, the illustrated elements are not limited to the specific scale in which they are illustrated in the drawings.

Hereinafter, a light emitting element according to the present disclosure and a light emitting display device including the same will be described with reference to the accompanying drawings.

Figure 2:
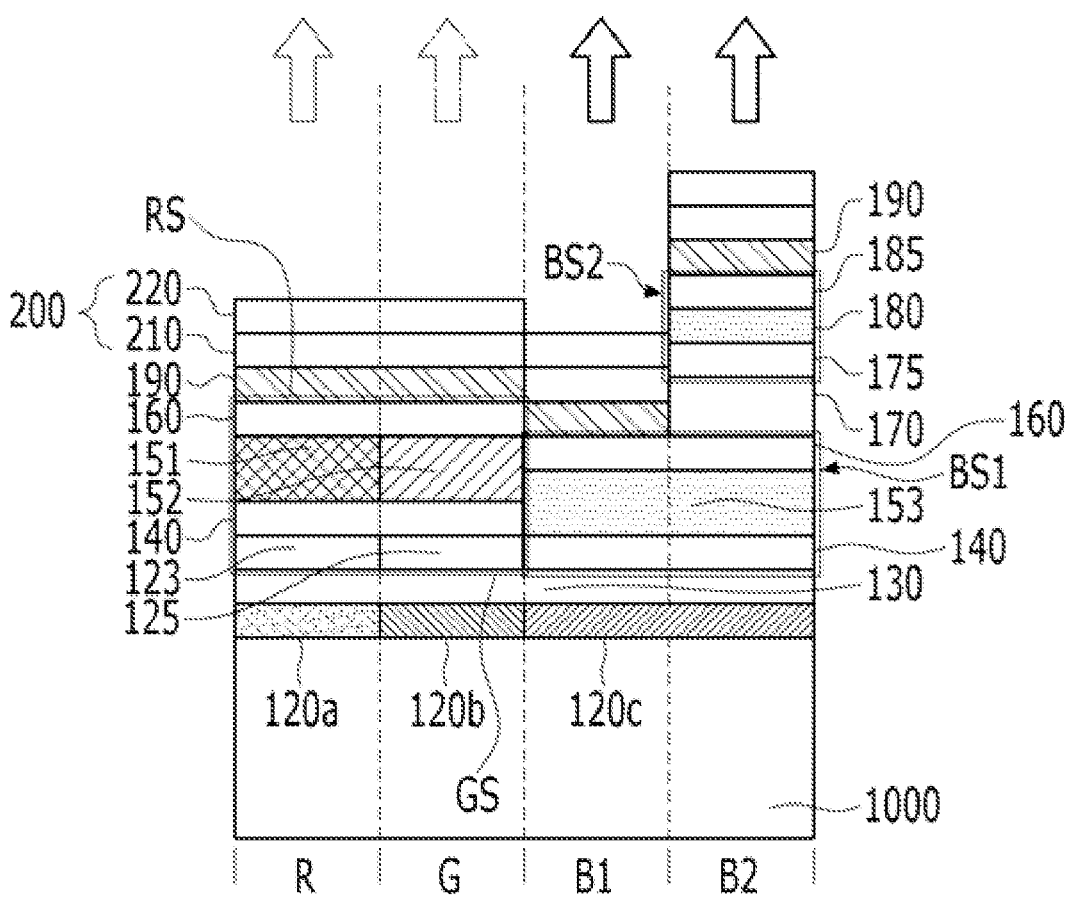
FIG. 2 is a schematic sectional view of the light emitting display device according to the embodiment of the present disclosure.
Figure 3:
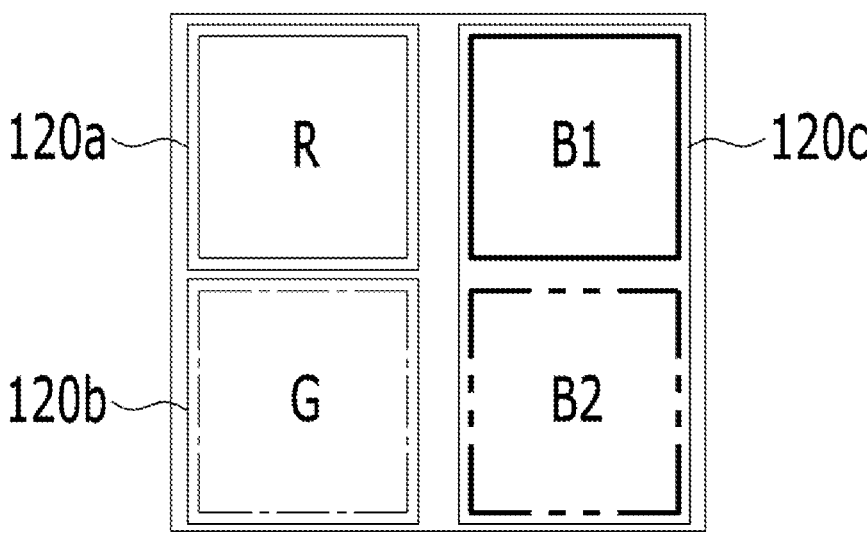
FIG. 3 is a plan view showing a light emitting display device according to a first embodiment of the present disclosure.
Figure 4:
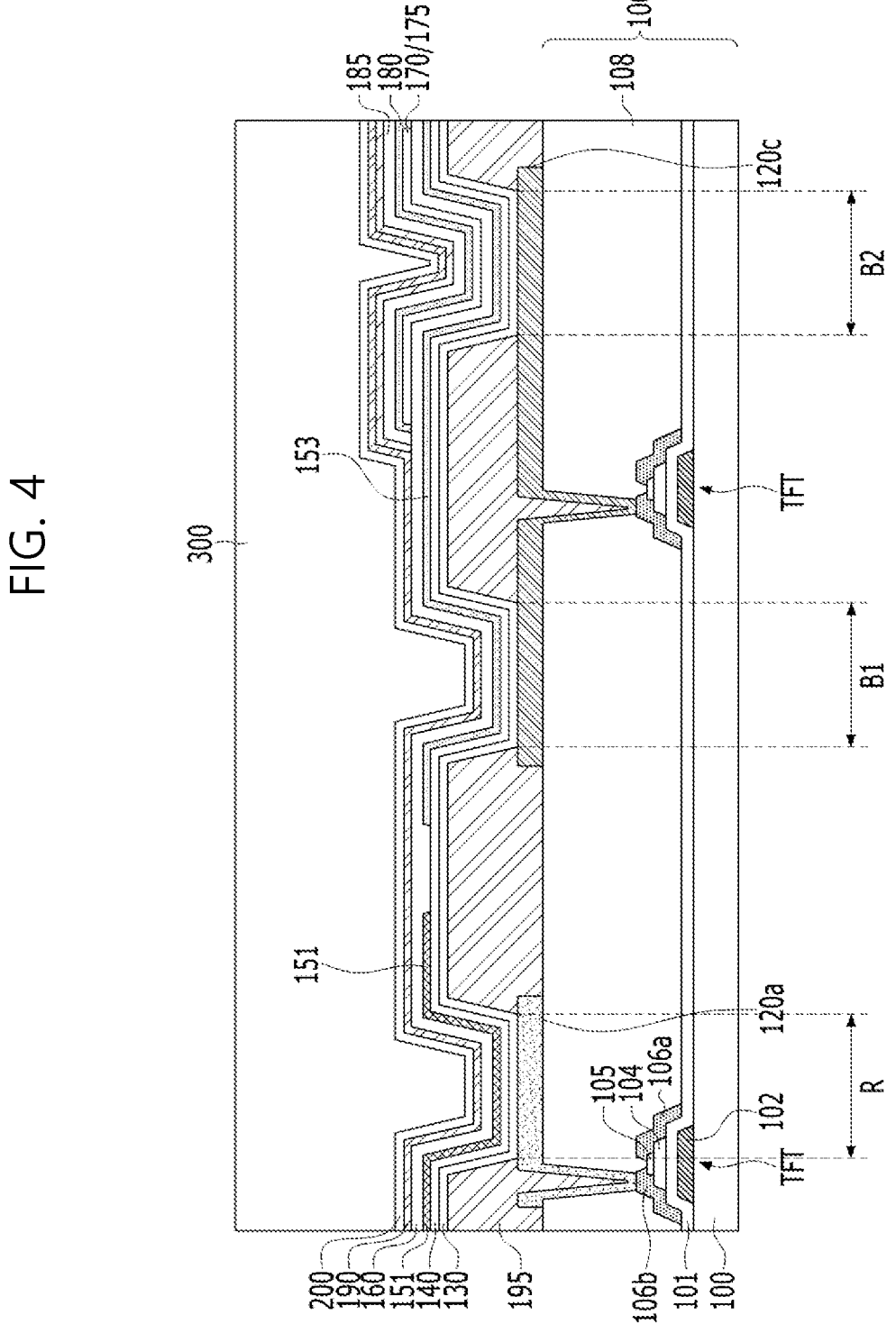
FIG. 4 is a sectional view taken along line I-I' of FIG. 1.
Figure 5:
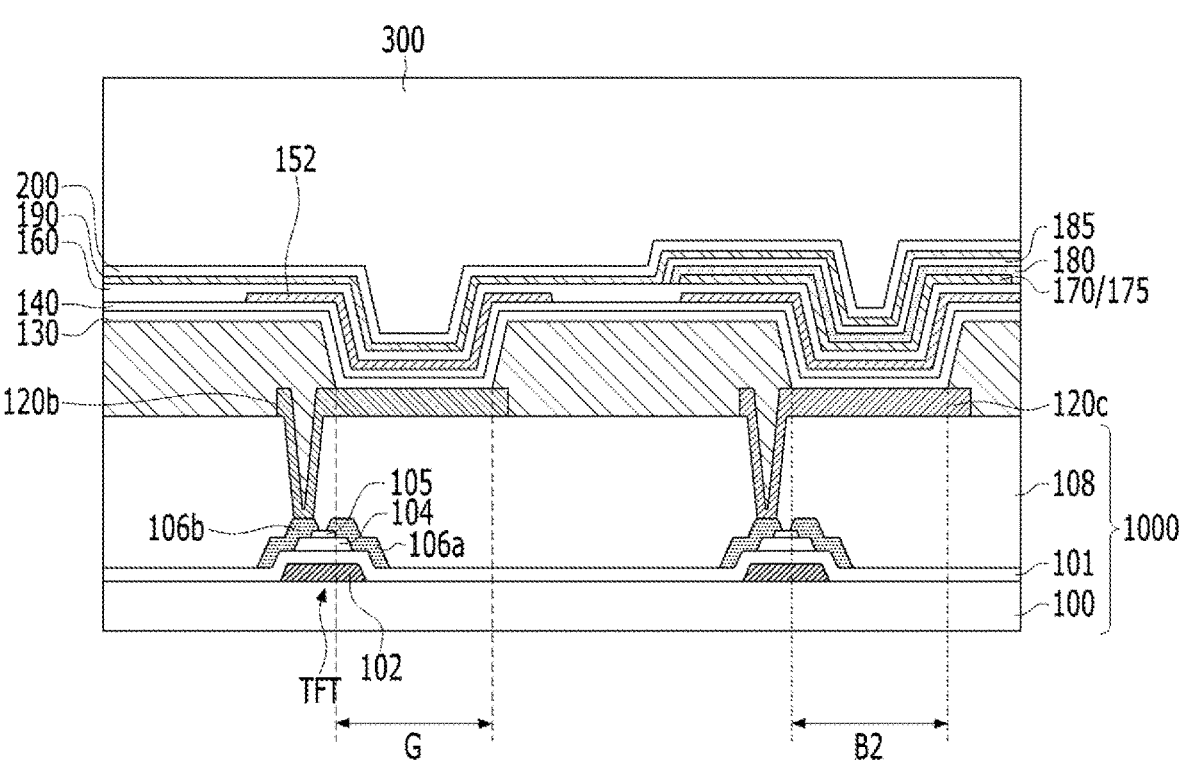
FIG. 5 is a sectional view taken along line II-II' of FIG. 1.

FIG. 1 is a plan view showing a light emitting display device according to a first embodiment of the present disclosure, and FIG. 2 is a schematic sectional view of the light emitting display device according to the first embodiment of the present disclosure. FIG. 3 is a plan view showing a light emitting display device according to the first embodiment of the present disclosure, FIG. 4 is a sectional view taken along line I-I' of FIG. 1, and FIG. 5 is a sectional view taken along line II-II' of FIG. 1.

Referring to FIGS. 1 to 5, the light emitting display device according to the embodiment of the present disclosure includes a bank 195 provided on a board 1000 (see FIG. 4), the bank being configured to expose first to fourth light emitting portions R, G, B1, and B2, first to third anodes 120a, 120b, and 120c provided at the first to fourth light emitting portions R, G, B1, and B2, a first light emitting stack RS, GS, and BS1 provided on the first to third anodes 120a, 120b, and 120c, a charge generation layer 170 and a second light emitting stack BS2 provided on the first light emitting stack BS1 in the fourth light emitting portion B2, and a cathode 190 provided on the first light emitting stack RS, GS, and BS1 of the first to third light emitting portions R, G, and B1 and the second light emitting stack BS2 of the fourth light emitting portion B2. The thin film transistor array board 1000 includes a substrate 100 with thin film transistors TFT disposed thereon.

In the light emitting display device according to the first embodiment of the present disclosure, the first to fourth light emitting portions R, G, B1, and B2 constitute a pixel P, and pixels P are repeatedly disposed on the board 1000.

In the light emitting display device according to the first embodiment of the present disclosure, the third light emitting portion B1 and the fourth light emitting portion B2, which emit the same color of light, are different from each other in terms of stack structure. That is, the fourth light emitting portion B2 further includes the charge generation layer 170 and the second light emitting stack BS2, compared to the third light emitting portion B1.

As an example, the first to third light emitting portions R, G, and B1 may be a red light emitting portion, a green light emitting portion, and a blue light emitting portion, respectively. The first to third light emitting portions may also have a combination of other color light emitting portions capable of expressing white through combination, in addition to red, green, and blue.

In the light emitting display device according to the first embodiment of the present disclosure, the third light emitting portion B1 and the fourth light emitting portion B2, which emit the same color of light but have different stack structures may be light emitting portions that emit color light having a lower efficiency in the same stack structure than the other color light emitting portions provided in the light emitting display device. When the efficiency of the red light emitting portion or the green light emitting portion is lower in the same stack structure than the efficiency of the blue light emitting portion, each light emitting portion other than the blue light emitting portion can have a dual stack structure.

In other words, the light emitting display device according to the first embodiment of the present disclosure may include two light emitting portions which emit the same color of light but have different structures (e.g. single and dual stack structures) for the color having the least efficiency.

The first to third light emitting portions R, G, and B1 respectively include a red light emitting layer 151, a green light emitting layer 152, and a first blue light emitting layer 153 in the first light emitting stack RS, GS, and BS1.

The fourth light emitting portion B2 includes a first blue light emitting layer 153, which is integrated (or formed as one layer) with the first blue light emitting layer 153, in the first light emitting stack BS1 of the third light emitting portion BS1 and further includes a second blue light emitting layer 180 in the second light emitting stack BS2.

As shown in FIG. 4, the third light emitting portion B1 and the fourth light emitting portion B2 can be separated from each other by the bank 195.

In the light emitting display device according to the first embodiment of the present disclosure, the third light emitting portion B1 emits light having the shortest wavelength. Also, one reason that the third light emitting portion B1 and the fourth light emitting portion B2 are separately provided as the light emitting portion that emits light having the shortest wavelength is as follows.

In the structure in which light emitting portions having different wavelengths are provided in the plane, the blue light emitting portion has a lower efficiency than the green light emitting portion and the red light emitting portion, when provided in the same stack structure. In the light emitting display device according to the first embodiment of the present disclosure, the third light emitting portion B1, which has a single light emitting stack, and the fourth light emitting portion B2, which has a plurality of light emitting stacks, are provided as the blue light emitting portion, whereby efficiency of blue light in the fourth light emitting portion B2 is improved. In the entirety of the light emitting display device, therefore, the blue light emission efficiency is improved on average.

In the same structure, a light emitting material having a relatively short wavelength has a lower visibility and efficiency than a light emitting material having a relatively long wavelength. In addition, it is preferable to widen the color gamut to express a color close to a natural color, and to increase a color gamut of a blue area, rather than a saturated green and red area. For example, the light emitting display device according to the first embodiment of the present disclosure including the red, green and blue light emitting portions, increases the blue color gamut emitting blue light having the shortest wavelength.

Here, the third light emitting portion B1 and the fourth light emitting portion B2 commonly have the same first blue light emitting layer 153. The first blue light emitting layer 153 is commonly provided in the third light emitting portion B1 and the fourth light emitting portion B2. The first blue light emitting layer 153 includes, e.g., a fluorescent dopant having an excellent lifespan characteristics, and the second blue light emitting layer 180 optionally provided in the fourth light emitting portion B2 includes, e.g., a non-fluorescent dopant having an excellent efficiency characteristics.

The non-fluorescent dopant may include a phosphorescent dopant or a thermally activated delayed fluorescent (TADF) dopant. The non-fluorescent dopant is better than the fluorescent dopant in terms of external quantum efficiency. However, the lifespan of the non-fluorescent dopant is reduced over time due to quenching characteristics in the light emitting layer. Therefore, the third light emitting portion B1 has a first blue light emitting layer 153 that uses the first light emitting stack BS1 and has only a fluorescent dopant and the fourth light emitting portion B2 has a first light emitting stack BS1 including a first blue light emitting layer 153 having a fluorescent dopant and a second light emitting stack BS2 including a second blue light emitting layer 180 having a phosphorescent dopant or a thermally activated delayed fluorescent dopant. As a result, it is possible to prevent lifespan reduction and pure color efficiency reduction that occur in a structure using only a non-fluorescent dopant.

A third anode 120c of the third light emitting portion B1 and a third anode 120c of the fourth light emitting portion B2 can be integrally formed and horizontally connected to each other. Depending on circumstances, the third anode 120c of the third light emitting portion B1 can be disposed spaced apart from the third anode 120c of the fourth light emitting portion B2.

As shown in FIG. 4, the bank 195 is provided between the third light emitting portion B1 and the fourth light emitting portion B2, whereby the third light emitting portion B1 and the fourth light emitting portion B2 are separated from each other, such that blue light is emitted from different stacks, whereby efficiency and lifespan are compensated. In addition, each of the third light emitting portion B1 and the fourth light emitting portion B2, which emit the same color light, have a dual stack structure. Finally, the full width at half maximum of light emitted from the third light emitting portion B1 and the full width at half maximum of light emitted from the fourth light emitting portion B2 can be different from each other, whereby it is possible to reduce a color coordinate deviation depending on change in viewing angle.

Further, the third light emitting portion B1 and the fourth light emitting portion B2 exhibit the average of efficiencies of the first blue light emitting layer 153 and the second blue light emitting layer 180 when expressing blue. In addition, the third light emitting portion B1 and the fourth light emitting portion B2 can have low blue coordinates capable of expressing pure blue, and an overlap area of a required color gamut range can be increased, whereby it is possible to improve pure blue expression. Examples of a reference color gamut include BT2020 and DCI-P3. In more detail, BT2020 is a next-generation standard color gamut approved first by the International Telecommunication Union (ITU) in June of 2014. BT2020, which is a color gamut devised in order to correspond to UHDTV environments, supports brightness of 10,000 nits in consideration of HDR mastering.

In addition, DCI-P3 is color gamut defined by Digital Cinema Initiatives so as to be used as color gamut of a digital projector in the American movie industry. DCI-P3 is capable of expressing color gamut 25% wider than sRGB and has particularly wide red coverage. Also, the blue efficiency and pure color recall are extended, whereby 99% or more overlap with the color gamut of DCI-P3 can be achieved.

Concrete effects will be described with reference to a table for each of Experimental Examples.

As shown in FIG. 2, each of the first to fourth light emitting portions R, G, and B1 and B2 may include a first common layer 130 located between the first to third anodes 120a, 120b, and 120c and the first light emitting stacks RS, GS, and BS1, in particular between the first to third anodes 120a, 120b, and 120c and the red light emitting layer 151, the green light emitting layer 152, and the first blue light emitting layer 153.

The first common layer 130 may include a hole injection layer HIL and a hole transport layer HTL. In particular, the hole injection layer HIL and the hole transport layer HTL can be formed as a single layer depending on circumstances. In addition, at least one of the hole injection layer HIL and the hole transport layer HTL may include a plurality of layers as needed. Also, the first common layer 130 can be formed with a first material and a second material alternately stacked to perform both hole injection and hole transport.

As shown in FIG. 2, the first light emitting stack RS, GS, and BS1 can further include a second common layer 160 on the red light emitting layer 151, the green light emitting layer 152, and the first blue light emitting layer 153.

The second common layer 160 may include a hole blocking layer HBL and an electron transport layer ETL. In particular, the hole blocking layer HBL, which limits holes in the red light emitting layer 151, the green light emitting layer 152, and the first blue light emitting layer 153, has a lower HOMO level value than the electron transport layer ETL to prevent holes from escaping in a direction toward the electron transport layer ETL.

Depending on circumstances, any one of the hole blocking layer and the electron transport layer of the second common layer 160 can be omitted. In addition, at least one of the hole blocking layer and the electron transport layer can be formed in a plurality of layers.

Further, as shown in FIG. 2, the first to third light emitting portions R, G, and B1 have the first light emitting stack RS, GS, and BS1, respectively, and the fourth light emitting portion B2 has the first light emitting stack B1 and the second light emitting stack BS2. The fourth light emitting portion B2 further includes the charge generation layer 170 provided between the first and second light emitting stacks BS1 and BS2.

Also, the first to third light emitting portions R, G, and B1 having the first light emitting stack RS, GS, and BS1 can be different from each other in terms of the optimum resonance distance. Therefore, as shown in FIG. 2, to adjust the resonance distance for each emission color, hole transport auxiliary layers 123 and 125 can be further provided between the first common layer 130 and the light emitting layers 151 and 152 of the first light emitting stack.

As shown in FIG. 2, the first light emitting stacks RS, GS, BS1 and BS2 can further include an electron blocking layer

140 commonly provided in the first to fourth light emitting portions R, G, B1, and B2. In more detail, the electron blocking layer is configured to limit electrons in the respective light emitting layers 151, 152, and 153 and to prevent electrons from escaping in a direction toward the first to third anodes 120a, 120b, and 120c. The electron blocking layer 140 is optional, and can be omitted depending on circumstances. Alternatively, the electron blocking layer 140 can have different thicknesses and materials in the red light emitting layer 151, the green light emitting layer 152, and the first blue light emitting layer 153. In this instance, the electron blocking layer 140 can be optionally provided in a specific light emitting portion, or the thickness of the electron blocking layer 140 provided in the specific light emitting portion can be increased.

Further, the hole transport auxiliary layers 123 and 125 are provided to compensate for the resonance distance for each emission color. As shown in FIG. 2, the hole transport auxiliary layers 123 and 125 can be provided between the first common layer 130 and the electron blocking layer 140, or be provided between the electron blocking layer of the light emitting layer of the first light emitting stack depending on circumstances.

As the result of optional application of the hole transport auxiliary layers 123 and 125, the thickness of the first light emitting stack RS and GS in the first light emitting portion R and the second light emitting portion G can be greater than the thickness of the first light emitting stack BS1 in the third light emitting portion B1 and the fourth light emitting portion B2. In addition, the thickness of the first light emitting stack RS in the first light emitting portion R can be greater than the thickness of the first light emitting stack GS of the second light emitting portion G. The thickness of the first light emitting stack RS in the first light emitting portion R can also be greatest among the first to fourth light emitting portions R, G, B1, and B2.

In addition, as shown in FIG. 2, the second light emitting stack BS2 can further include a hole transport layer 175 under the second blue light emitting layer 180 and an electron transport layer 185 above the second blue light emitting layer 180, in addition to the second blue light emitting layer 180. The second light emitting stack BS2 may consist of the second blue light emitting layer 180, a hole transport layer 175 under the second blue light emitting layer 180 and an electron transport layer 185 above the second blue light emitting layer 180.

Each of the hole transport layer 175 and the electron transport layer 185 can also include a plurality of layers as needed.

Further, the charge generation layer 170 may be interposed between the first light emitting stack BS1 and the second light emitting stack BS2 of the fourth light emitting portion B2. The charge generation layer 170 can be formed by stacking an n-type charge generation layer and a p-type charge generation layer. Depending on circumstances, the hole transport layer can be omitted from the second light emitting stack BS2, and rather the p-type charge generation layer in the charge generation layer 170 can perform the function of the hole transport layer.

As shown, the cathode 190 is also provided on the second common layer 160 of the first to third light emitting portions R, G, and B1 and on the electron transport layer 185 of the second light emitting stack BS2 of the fourth light emitting portion B2. The cathode 190 can include a plurality of layers such as a metal layer or an inorganic compound layer having the function of an electron injection layer provided at the interface at which the second common layer 160 and the electron transport layer 185 about each other or are in contact with each other in the multilayer structure.

As shown in FIG. 2, a capping layer 200 can be further provided on the cathode 190. In more detail, the capping layer 200 can include a first capping layer 210 and a second capping layer 220 made of different materials. The first capping layer 210 and the second capping layer 220 can be transparent dielectric films having different refractive indexes. Alternatively, one of the first capping layer 210 and the second capping layer 220 can be an organic or inorganic dielectric film, and the other can be an inorganic or organic dielectric film.

As shown, the capping layer 200 covers the cathode 190, protects a light emitting element constituted by the anodes 120a to 120c, the cathode 190, and the first light emitting stack RS, GS, and BS1, the charge generation layer 170, and the second light emitting stack BS2 provided between the anodes 120a to 120c and the cathode 190, and improves the emission of light from the light emitting element.

In the fourth light emitting portion B2, one of the first blue light emitting layer 153 and the second blue light emitting layer 180 can include a fluorescent dopant and the other can include a phosphorescent dopant, whereby the color purity is improved and the color gamut is extended.

Particularly, the first blue light emitting layer 153 commonly provided in the third and fourth light emitting portions B1 and B2, which emit the same color light, includes a fluorescent dopant, and the second blue light emitting layer 180 provided in only the fourth light emitting portion B2 includes a phosphorescent dopant, whereby it is possible to improve efficiency, to increase the lifespan, to extend the color gamut, and to remarkably reduce the change in color deviation depending on the viewing angle change, compared to a single stack structure.

Also, in the light emitting display device according to the first embodiment of the present disclosure, it is possible to remarkably reduce the change in color deviation depending on the viewing angle change, compared to when the color coordinate characteristics are greatly changed due to the viewing angle change when the blue light emitting layer has a plurality of stack structures in a single light emitting portion and a fluorescent dopant and a phosphorescent dopant are used in different stacks.

The light emitting display device according to the first embodiment of the present disclosure includes first and second anodes 120a and 120b provided respectively in a first light emitting portion R and a second light emitting portion G and a third anode 120c commonly provided in a third light emitting portion B1 and a fourth light emitting portion B2.

The stack structure of each of the first to fourth light emitting portions R, G, B1, and B2 is identical or similar to what was described with reference to FIG. 2. That is, in the first light emitting portion R, as shown in FIGS. 3 and 4, a first common layer 130, which is a hole injection layer, is provided on the first anode 120a, a hole transport or electron blocking layer 140 is provided on the first common layer 130, a red light emitting layer 151 is provided on the electron blocking layer 140, a second common layer 160, which is an electron transport layer, is provided on the red light emitting layer 151, and a cathode 190 is provided on the second common layer 160.

In the second light emitting portion G, as shown in FIGS. 3 and 5, a first common layer 130, which is a hole injection layer, is provided on the second anode 120b, a hole transport or electron blocking layer 140 is provided on the first common layer 130, a green light emitting layer 152 is provided on the electron blocking layer 140, a second common layer 160, which is an electron transport layer, is provided on the green light emitting layer 152, and a cathode 190 is provided on the second common layer 160.

In the third light emitting portion B1, as shown in FIGS. 3 and 4, a first common layer 130, which is a hole injection function layer, is provided on the third anode 120c, a hole transport or electron blocking function layer 140 is provided on the first common layer 130, a first blue light emitting layer 153 is provided on the electron blocking function layer 140, a second common layer 160, which is an electron transport function layer, is provided on the first blue light emitting layer 153, and a cathode 190 is provided on the second common layer 160.

As shown in FIGS. 3, 4 and 5, the fourth light emitting portion B2 further includes a second light emitting stack including a charge generation layer 170, a hole transport layer 175, a second blue light emitting layer 180, and an electron transport layer 185, compared to the third light emitting portion B1.

In addition, the red light emitting layer 151 has a light emission peak at a wavelength of 600 nm to 650 nm, and the green light emitting layer 152 has a light emission peak at a wavelength of 500 nm to 590 nm.

Each of the first blue light emitting layer 153 and the second blue light emitting layer 180 also has a light emission peak at a wavelength of 420 nm to 490 nm. In addition, the first blue light emitting layer 153 may include a fluorescent dopant, and the second blue light emitting layer 180 may include a non-fluorescent dopant, such as a phosphorescent dopant or a thermally activated delayed fluorescent dopant.

Depending on circumstances, the charge generation layer 170 can also be an n-type charge generation layer, and the hole transport layer 175 can be integrally formed with a p-type charge generation layer. Further, the cathode 190 and a capping layer 200 are sequentially formed on the second common layer 160 of the first to third light emitting portions R, G, and B1 and the electron transport layer 185 of the fourth light emitting portion B2.

Also, the lower surface of the cathode 190 contacts the second common layer 160 of the first to third light emitting portions R, G, and B1 and contacts the electron transport layer 185 of the fourth light emitting portion B2. The lower surface of the cathode 190 also contacts the second common layer 160, which has an electron transport function, and the electron transport layer 185 of the first to fourth light emitting portions R, G, B1, and B2. The first anode 120a, the second anode 120b, and the third anode 120c are connected to a thin film transistor TFT provided on a substrate 100 and receive drive current.

In the light emitting display device according to the present disclosure, the board 1000, on which the first to third anodes 120a, 120b, and 120c are formed, is a thin film transistor array board including a substrate 100, a thin film transistor TFT, and a passivation film 108 configured to protect the thin film transistor TFT. The substrate 100 includes at least one of a plastic plate, a glass plate, and a metal plate. The substrate 100 may be flexible or rigid depending on material or ingredient.

The passivation film 108 can also be constituted by a plurality of films depending on circumstances. An upper film may be flat, and the first to fourth light emitting portions R, G, B1, and B2 can be defined on the upper surface of the flat passivation film 108.

As an example, the thin film transistor TFT includes a gate electrode 102, a semiconductor layer 104 overlapping the gate electrode 102, and a first electrode 106a and a second electrode 106b connected to both sides of the semiconductor layer 104. A gate dielectric film 101 is also interposed between the gate electrode 102 and the semiconductor layer 104. Further, a channel passivation layer 105 is provided on a channel of the semiconductor layer 104 to prevent direct connection between the first electrode 106a and the second electrode 106b on the channel of the semiconductor layer 104 while maintaining intrinsic characteristics.

One of the first electrode 106a and the second electrode 106b of the thin film transistor TFT can also be a source electrode, and the other can be a drain electrode. One of the first electrode 106a and the second electrode 106b can be connected to each of the anodes 120a, 120b, and 120c.

Further, a bank 195 is provided to expose the light emitting portions R, G, B1, and B2 of the first to third anodes 120a, 120b, and 120c. The bank 195 can be provided overlapping the edge of each of the first and second anodes 120a and 120b.

As shown in FIGS. 4 and 5, the third anode 120c is integrally formed in the third and fourth light emitting portions B1 and B2, and the bank 195 is provided between the third and fourth light emitting portions B1 and B2 as well as on the edge of the third anode 120c. One third anode 120c is provided in the third and fourth light emitting portions B1 and B2. The third anode 120c is connected to the one thin film transistor TFT, i.e. the same thin film transistor TFT for the third and fourth light emitting portions B1 and B2, to transmit drive current to the third and fourth light emitting portions B1 and B2.

Also, a first common layer 130, which is a hole injection function layer, is provided on the third anode 120c, a hole transport or electron blocking function layer 140 is provided on the first common layer 130, a first blue light emitting layer 153 is provided on the electron blocking function layer 140, a second common layer 160, which is an electron transport function layer, is provided on the first blue light emitting layer 153, and a cathode 190 is provided on the second common layer 160.

As shown, the lower surface of the electron transport layer 185 in the second light emitting stack BS2 of the fourth light emitting portion B2 between the third and fourth light emitting portions B1 and B2 is more widely formed than the second blue light emitting layer 180, and contacts the second common layer 160 of the first light emitting stack BS1. Consequently, a portion having a step as the result of provision of different stack structures in the third and fourth light emitting portions B1 and B2 is covered by the electron transport layer 185, the electron transport layer 185 outside the step abuts the second common layer 160 common in the first to fourth light emitting portions R, G, B1, and B2, and the electron transport layer 185 and the second common layer 160 that contact a lower surface of the cathode 190 have a same electron transport function in the first to fourth light emitting portions R, G, B1, and B2.

Meanwhile, an encapsulation layer 300 is provided on the capping layer 200. Specifically, an encapsulation layer 300 configured to protect a light emitting element constituted by the first to third anodes 120a, 120b, and 120c provided in the first to fourth light emitting portions R, G, B1, and B2, the cathode 190, and the first light emitting stack RS, GS, and BS1 and the second light emitting stack BS2 between the first to third anodes 120a, 120b, and 120c and the cathode 190 is provided on the capping layer 200.

In addition, the encapsulation layer 300 may include at least one inorganic encapsulation layer and at least one organic encapsulation layer. The inorganic encapsulation layer and the organic encapsulation layer of the encapsulation layer 300 may be alternately disposed.

As shown in FIGS. 4 and 5, the light emitting display device according to the embodiment of the present disclosure includes a first anode 120a provided in an area including at least the first light emitting portion R, a second anode 120b provided in an area including at least the second light emitting portion G, and a third anode 120c provided over the third and fourth light emitting portions B1 and B2. The first anode 120a, the second anode 120b, and the third anode 120c are separated from each other. The third anode 120c is also commonly provided in the third and fourth light emitting portions B1 and B2, which are separated from each other by the bank 195, and can be driven by the same signal. Also, a first light emitting layer 151 is provided on the first anode 120a, a second light emitting layer 152 is provided on the second anode 120b, and a third light emitting layer 153 is provided on the third anode 120c. The third light emitting layer 153 overlaps both the third and fourth light emitting portions B1 and B2, and is provided on the third anode 120c.

Also, a charge generation layer 170 and a fourth light emitting layer 180 are sequentially provided on the third light emitting layer 153 so as not to overlap the third light emitting portion B1 but to overlap the fourth light emitting portion B2, and a cathode 190 and a capping layer 200 are commonly provided on the first to fourth light emitting portions R, G, B1, and B2.

As shown, the cathode 190 is provided on the first light emitting layer 151, the second light emitting layer 152, and the third light emitting layer 153 provided in the same stack of the first to third light emitting portions R, G, and B1, and is provided on the fourth light emitting layer 180 of the fourth light emitting portion B2, which includes a plurality of stacks. The bank 195 is provided on the board 1000, and exposes the anodes 120a, 120b, and 120c of the first to fourth light emitting portions R, G, B1, and B2.

In addition, the lower surface of the cathode 190 in the first to third light emitting portions R, G, and B1 can directly contact the second common layer 151, which performs the function of an electron transport layer, and the lower surface of the cathode 190 in the fourth light emitting portion B2 can directly contact the electron transport layer 185.

In addition, the third light emitting layer 153 commonly provided in the third and fourth light emitting portions B1 and B2 includes a fluorescent dopant, and the fourth light emitting layer 180 optionally provided in the fourth light emitting portion B2 includes a non-fluorescent dopant. The non-fluorescent dopant may be a phosphorescent dopant or a thermally activated delayed fluorescent dopant.

A first common layer 130 including a hole injection layer and an electron injection layer can be provided between the first to third anodes 120a, 120b, and 120c and the first to third light emitting layers 151, 152, and 153. An electron blocking layer 140 configured to limit holes in the first to third light emitting layers 151, 152, and 153 can also be provided on the first common layer 130. Further, a second common layer 160, which performs an electron transport function, is provided between the first to third light emitting layers 151, 152, and 153 and the cathode 190.

The fourth light emitting portion B2 optionally further includes an additional stack. Specifically, the fourth light emitting portion B2 can further include an electron transport layer 185 between the fourth light emitting layer 180 and the cathode 190. In addition, a hole transport layer 175 can further be provided between the charge generation layer 170 optionally provided in the fourth light emitting portion B2 and the fourth light emitting layer 180.

Also, the charge generation layer 170 can include an n-type charge generation layer and a p-type charge generation layer. In this instance, the n-type charge generation layer can perform both an electron generation function and a function of transporting electrons to the second common layer 160 of the lower stack.

In addition, the p-type charge generation layer can perform both a hole generation function and a function of transporting holes to the upper stack provided in the second light emitting stack BS2. In this instance, the hole transport layer under the fourth light emitting layer 180 can be omitted, and rather the p-type charge generation layer can perform the function of the hole transport layer of the upper stack.

Further, the first light emitting layer 151 is a red emitting layer that emits red having a peak wavelength at a wavelength of 600 nm to 650 nm, and the second light emitting layer 152 is a green light emitting layer or a yellowish green light emitting layer having a peak wavelength at a wavelength of 510 nm to 590 nm.

Each of the third light emitting layer 153 and the fourth light emitting layer 180 is blue emitting layer that emits blue having a peak wavelength at 420 nm to 490 nm, and the third light emitting layer 153 and the fourth light emitting layer 180 are different from each other in terms of whether a fluorescent dopant is included. Also, each of the first to fourth light emitting layers 151, 152, 153, and 180 may include at least one host and at least one dopant.

Figure 6:
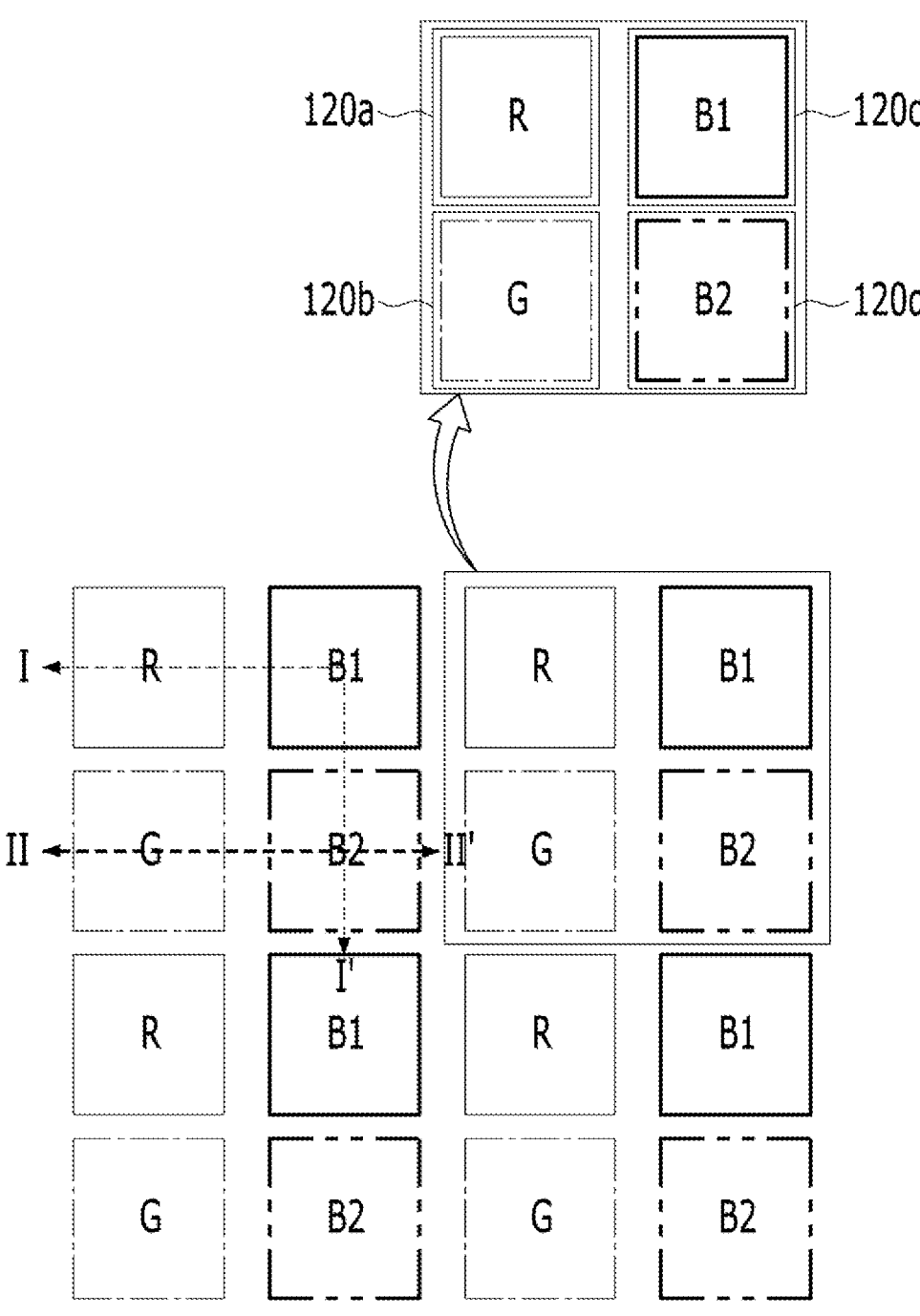
FIG. 6 is a plan view of a light emitting display device according to a second embodiment of the present disclosure.
Figure 7:
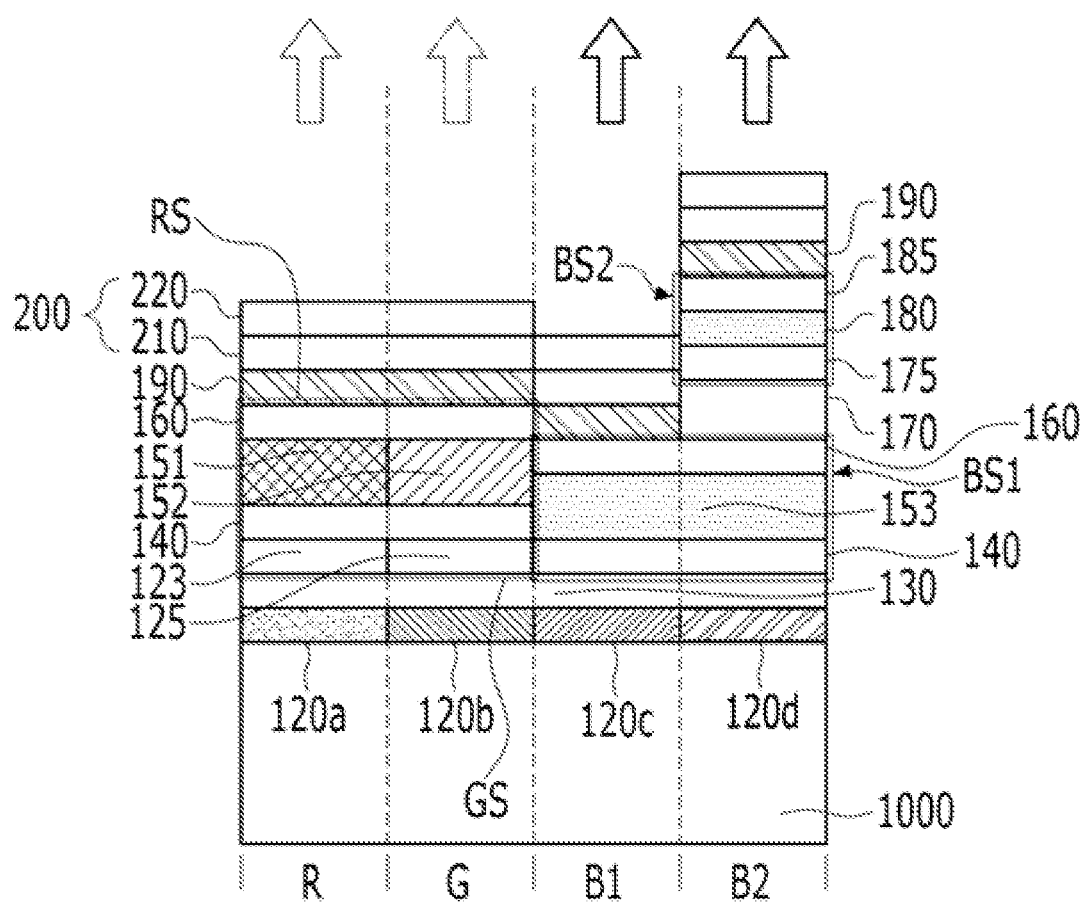
FIG. 7 is a sectional view of the light emitting display device according to the second embodiment of the present disclosure.

FIG. 6 is a plan view of a light emitting display device according to a second embodiment of the present disclosure, and FIG. 7 is a sectional view of a light emitting display device according to the second embodiment of the present disclosure.

Referring to FIGS. 6 and 7, the light emitting display device according to the second embodiment of the present disclosure is different from the light emitting display device according to the first embodiment of the present disclosure in that an anode of a third light emitting portion B1 and an anode of a fourth light emitting portion B2 are formed to be separated from each other. That is, a third anode 120c of the third light emitting portion B1 and a fourth anode 120d of the fourth light emitting portion B2 are separated from each other, and each of the third anode 120c and the fourth anode 120d is connected to an independent thin film transistor and receives an individual drive current.

Even in the light emitting display device according to the second embodiment of the present disclosure, a first light emitting stack BS1 including a first blue light emitting layer 153 is commonly formed in the third light emitting portion B1 and the fourth light emitting portion B2, and a second light emitting stack BS2 including a second blue light emitting layer 180 is optionally formed in the fourth light emitting portion B2.

Here, the effect of the light emitting display device according to the present disclosure will be described through experiments. In the light emitting display device according to the present disclosure, the blue light emitting portion is changed, and therefore a change due to color coordinates and viewing angle will be described through experiments in which the structure of the blue light emitting portion is changed.

Figure 8:
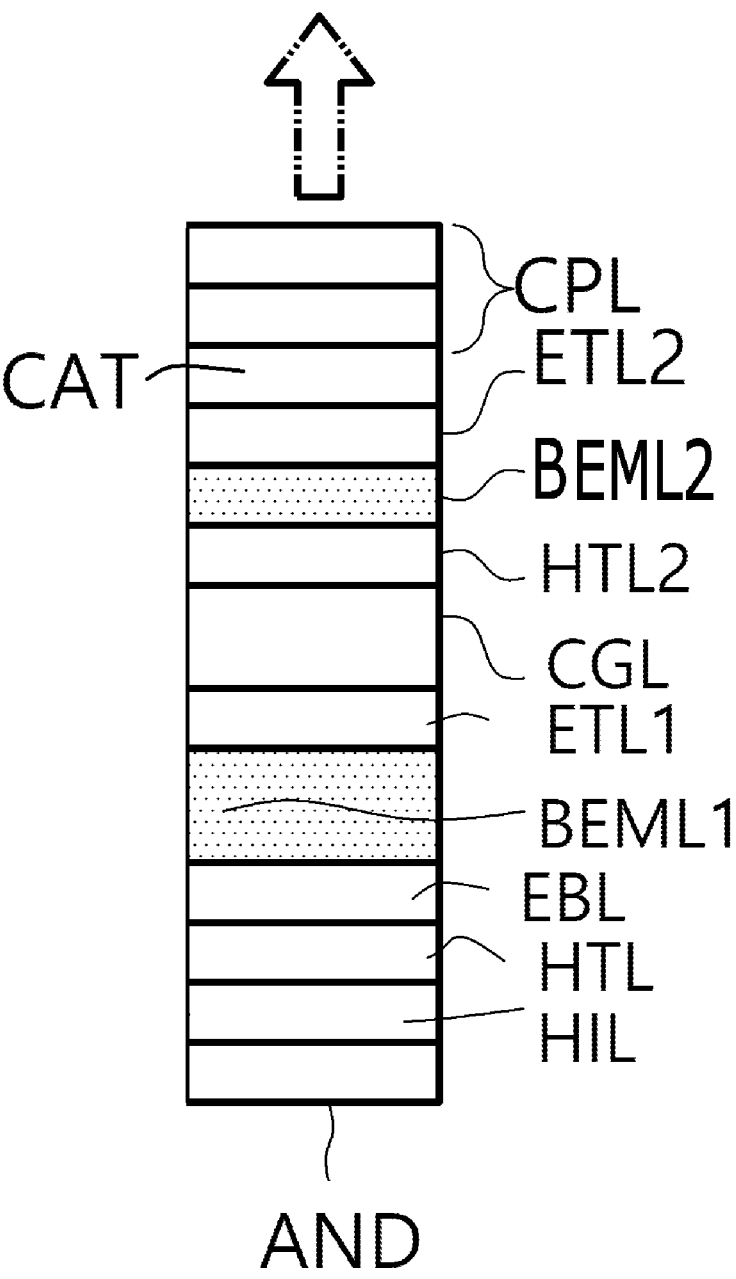
FIG. 8 is a sectional view of light emitting display devices according to first and second experimental examples of the present disclosure.

In particular, FIG. 8 is a sectional view of light emitting display devices according to first and second experimental examples of the present disclosure. As shown in FIG. 8, each light emitting display device according to the first and second experimental examples includes a two-stack structure in a blue light emitting portion.

In the light emitting display device according to the first experimental example, the same kind of light emitting dopant is used in the light emitting layers of a first light emitting stack and a second light emitting stack. In the blue light emitting portion, each of the blue light emitting layers of the first and second light emitting stacks includes a blue fluorescent dopant.

In addition, the light emitting display device according to the second experimental example is different from the light emitting display device according to the first experimental example because in the blue light emitting portion, the blue light emitting layer of the second light emitting stack uses only a blue phosphorescent dopant.

In addition, a light emitting display device according to a third experimental example has the structure of the light emitting display device according to the first embodiment of the present disclosure described with reference to FIGS. 2, 4, and 5.

Figure 10A:
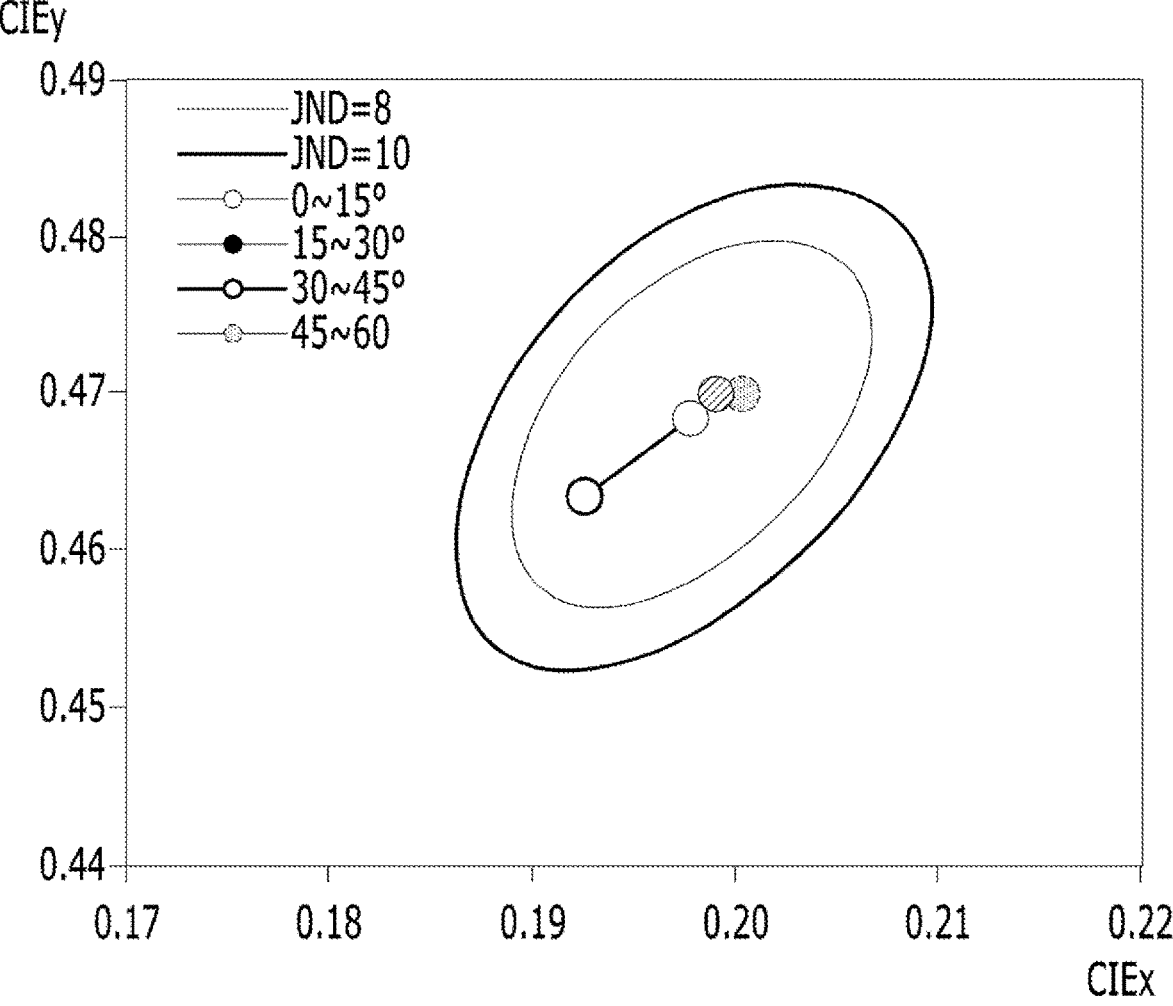
FIGS. 10A and 10B are graphs showing color coordinate change of the light emitting display devices according to the second and third experimental examples of the present disclosure depending on viewing angle change thereof.

That is, in the light emitting display device according to the third experimental example, the blue light emitting portion includes a third light emitting portion B1 and a fourth light emitting portion B2, the third light emitting portion B1 includes a first light emitting stack BS1 having a first blue light emitting layer 153 including a fluorescent dopant, and the fourth light emitting portion B2 includes a first light emitting stack BS1 and a second light emitting stack BS2 provided on the first light emitting stack BS1, the second light emitting stack BS2 includes a charge generation layer 170 and a second blue light emitting layer 180 including a phosphorescent dopant.

stacks, the first blue light emitting layer includes a blue fluorescent dopant, and the second blue light emitting layer includes a blue phosphorescent dopant, as shown in FIG. 8, Δu'v' color coordinate change of 0.0071 is exhibited when the viewing angle is changed from 0° to 30°, and a deviation of 0.0051 is exhibited when the viewing angle is changed from 30° to 45°, as shown in Table 1, Table 2, and FIG. 10A. Consequently, the color coordinate deviation due to the viewing angle change is great, whereby a color difference can be readily apparent when the viewing angle is changed.

In contrast, as shown in FIGS. 2 to 5, the light emitting display device according to the first embodiment of the present disclosure is configured such that the blue light emitting portion includes a third light emitting portion B1 including a first light emitting stack BS1 having a first blue light emitting layer 153 including a blue fluorescent dopant and such that a second light emitting stack BS2 having a second blue light emitting layer 180 including a phosphorescent dopant is stacked on the first light emitting stack BS1. Therefore, in the light emitting display device according to the first embodiment of the present disclosure, the Δu'v' color coordinate change of 0.0048 is exhibited when the viewing angle is changed from 0° to 30°, and a deviation of 0.0039 is exhibited when the viewing angle is changed from 30° to 45°, as shown in Table 1, Table 2, and FIG. 10B. Consequently, the color coordinate deviation due to the viewing angle change is reduced, and therefore the color difference recognition can be reduced even though the viewing angle is changed.

TABLE 1

| Viewing angle | Ex1 | | | Ex2 | | | Ex3 | | |
| | Lumi (%) | Δu'v' | JND | Lumi (%) | Δu'v' | JND | Lumi (%) | Δu'v' | JND |
|---|---|---|---|---|---|---|---|---|---|
| 0° | 100 | 0.0000 | — | 100 | 0.0000 | — | 100 | 0.0000 | — |
| 30° | 70 | 0.0078 | 5.4 | 64 | 0.0071 | 5.2 | 75 | 0.0048 | 1.8 |
| 45° | 40 | 0.0005 | 0.5 | 36 | 0.0020 | 1.5 | 44 | 0.0010 | 4.6 |
| 60° | 23 | 0.0008 | 0.9 | 21 | 0.0030 | 2.6 | 25 | 0.0024 | 1.3 |

TABLE 2

| Δu'v' | Ex1 | Ex2 | Ex3 |
|---|---|---|---|
| 0° to 30° | 0.0078 | 0.0071 | 0.0048 |
| 30° to 45° | 0.0074 | 0.0051 | 0.0038 |
| 46° to 60° | 0.0003 | 0.0010 | 0.0014 |

Figure 9:
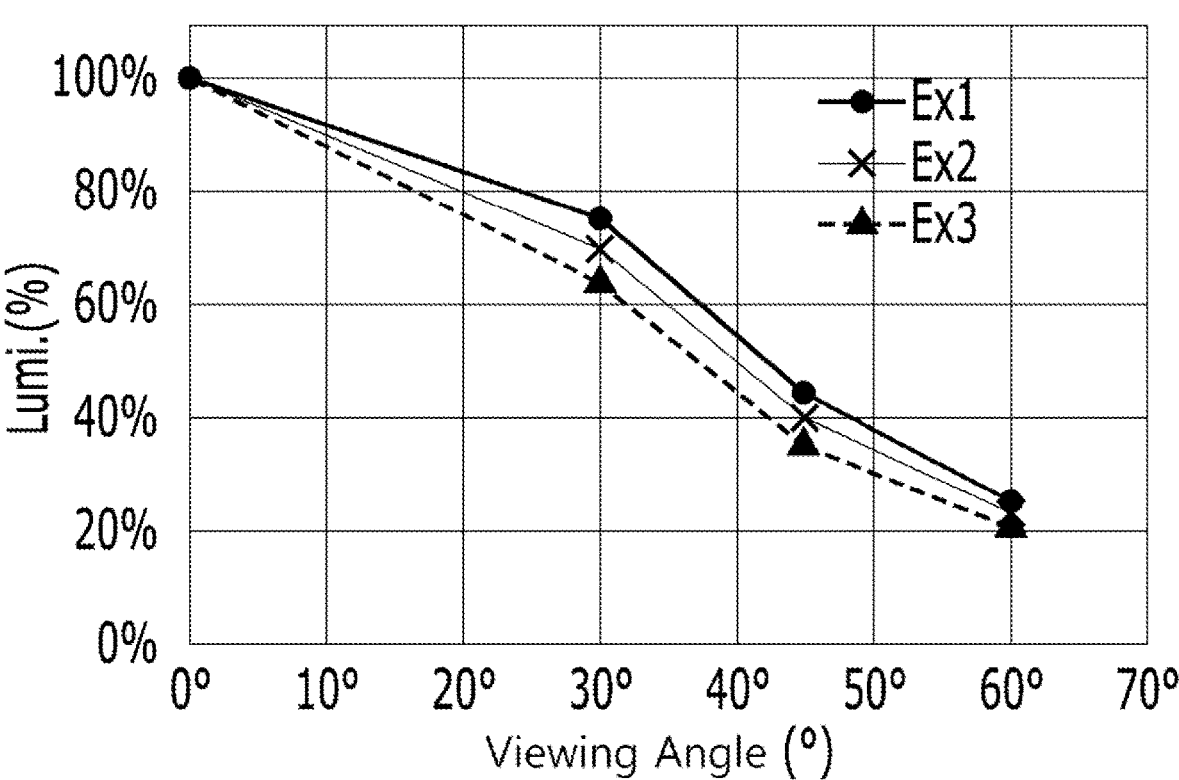
FIG. 9 is a graph showing luminance change of light emitting display devices according to first to third experimental examples of the present disclosure depending on viewing angle thereof.

FIG. 9 is a graph illustrating a luminance change of the light emitting display devices according to the first to third experimental examples of the present disclosure depending on a viewing angle change thereof. In addition, FIGS. 10A and 10B are graphs illustrating a color coordinate change of the light emitting display devices according to the second and third experimental examples of the present disclosure depending on a viewing angle change thereof.

As shown, Table 1, Table 2, and FIG. 9, illustrate that, in the third experimental example according to the first embodiment of the present disclosure, the luminance reduction depending on the viewing angle change is smallest. In Table 1, Lumi is a relative luminance compared to the front, Δu'v' is a change in color coordinate compared to the front, and JND is a value indicating the extent that a color coordinate fluctuation range compared to the front.

Figure 10B:
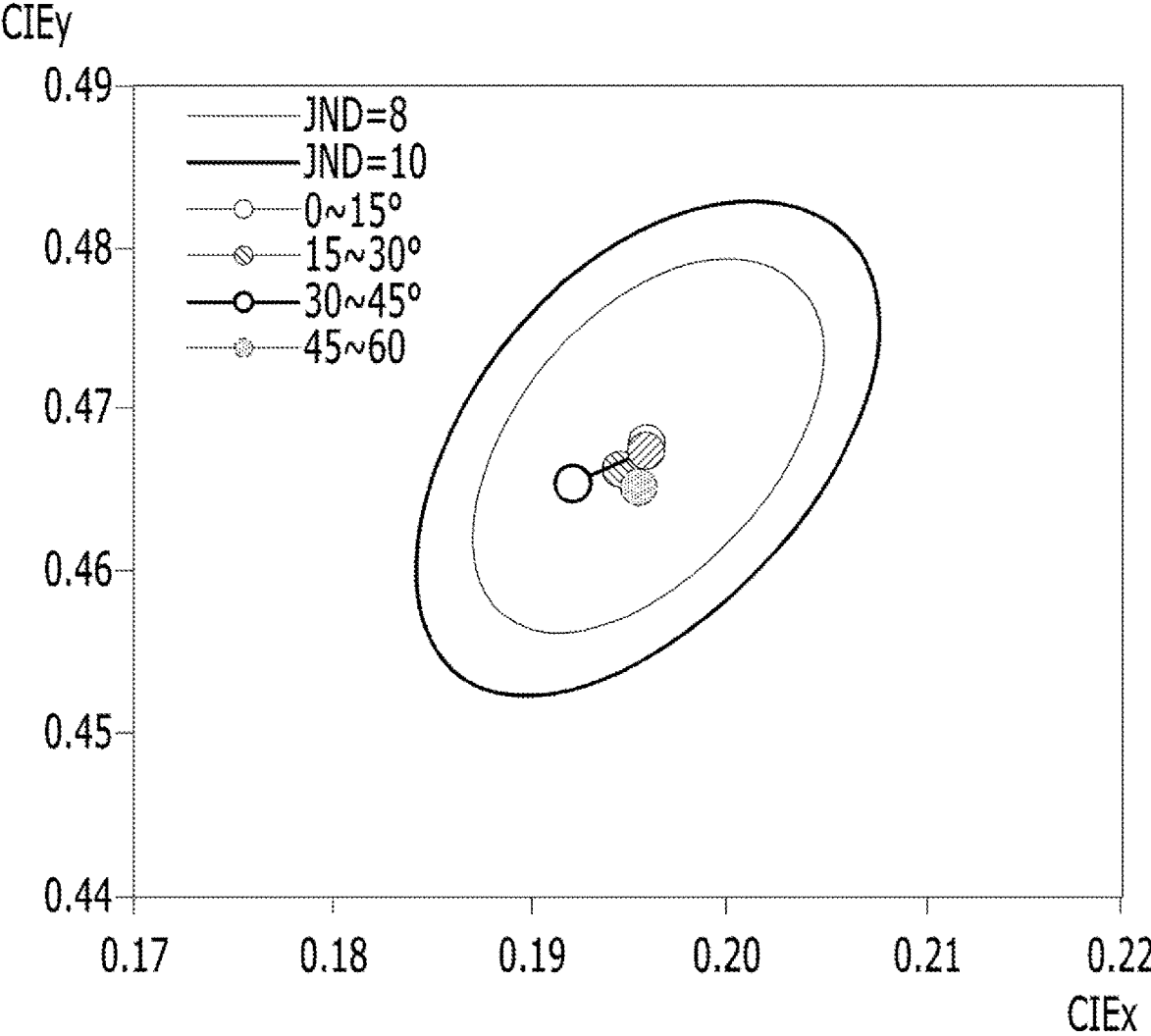

Also, in the light emitting display device according to the second experimental example, in which one blue light emitting portion includes first and second light emitting Also, in FIG. 10A, FIG. 10B, and Table 1, JND (just noticeable difference) is a value indicating the extent that a color coordinate fluctuation range depending on a viewing angle change deviates from color coordinates at a viewing angle of 0°. In FIGS. 10A and 10B, an inner ellipse indicates a JND value of 8, and an outer ellipse indicates a JND value of 10. In Table 1, the JND value of each of the light emitting display devices according to the first to third experimental examples depending on each viewing angle means the JND value at each viewing angle in a corresponding one of the experimental examples, and that the JND value is small means that the degree of deviation from the color coordinate at a viewing angle of 0° is small.

As shown in FIG. 10A and Table 1, in the light emitting display device according to the second experimental example (Ex2), the JND value at a viewing angle of 0° to 30°, which is mainly observed, is 5.2, whereby it can be determined that outstanding color deviation is visible, compared to the light emitting display device according to the third experimental example (Ex3) having a JND value of 1.8, as shown in FIG. 10B and Table 1.

By characteristics, color gamut, and light emission spectrum of a fourth experimental example (Ex4) including a phosphorescent dopant commonly provided in blue light emitting layers in the structure in which two light emitting stacks are stacked, as shown in FIG. 8 were observed together with the first to third experimental examples (Ex1, Ex2, and Ex3). In the third experimental example (Ex3), the ratio in area of the third light emitting portion B1 of the single blue light emitting stack structure to the fourth light emitting portion B2 of the plural blue light emitting stack structures was 1:1.

By characteristics and color gamut of fifth to eighth experimental examples (Ex5a, Ex5b, Ex5c, and Ex5d) configured such that the ratio in area of the third light emitting portion B1 of the single blue light emitting stack structure to the fourth light emitting portion B2 of the plural blue light emitting stack structure was 3:1, 2:1, 1:2, and 1:3, as modifications of the third experimental example (Ex3), were also observed.

Figure 11:
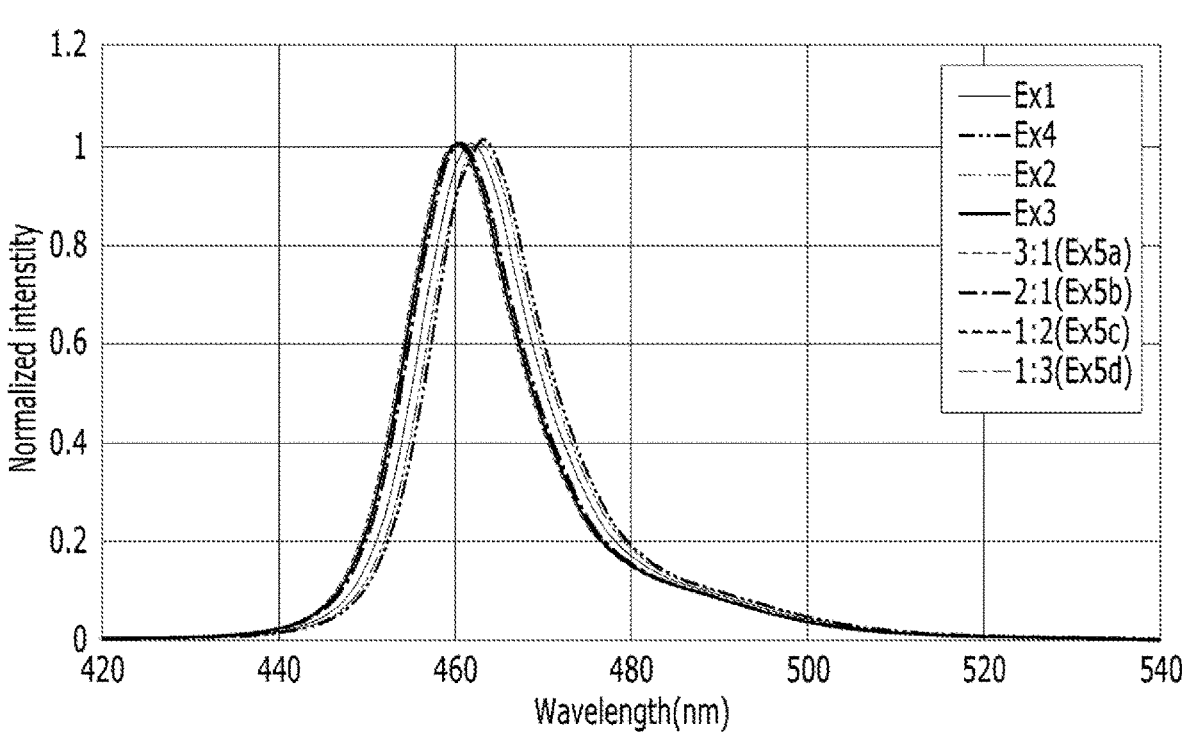
FIG. 11 is a graph showing light emission spectra of first to eighth experimental examples.

Next, FIG. 11 is a graph illustrating a light emission spectra of the first to eighth experimental examples.

TABLE 3

| Experimental examples (B1:B2 area ratio) | By | Color gamut area (%) | DCI-P3 overlap ratio (%) |
|---|---|---|---|
| Ex1 [fluorescent/fluorescent] | 0.044 | 109 | 100.00 |
| Ex5a (3:1) [fluorescent/phosphorescent] | 0.048 | 109 | 100.00 |
| Ex5b (2:1) [fluorescent/phosphorescent] | 0.049 | 109 | 100.00 |
| Ex3 (1:1) [fluorescent/phosphorescent] | 0.051 | 108 | 100.00 |
| Ex5c (1:2) [fluorescent/phosphorescent] | 0.054 | 108 | 100.00 |
| Ex5d (1:3) [fluorescent/phosphorescent] | 0.055 | 108 | 100.00 |
| Ex6 | 0.056 | 108 | 99.99 |
| Ex2 [fluorescent/phosphorescent | 0.059 | 107 | 99.76 |
| Ex4 [phosphorescent/phosphorescent] | 0.068 | 106 | 98.5 |

As shown in Table 3 and FIG. 11, as the amount of the phosphorescent dopant used in the blue light emitting portion is increased, the color purity is lowered, as in the fourth experimental example (Ex4). In particular, as shown in FIG. 11, as the amount of the phosphorescent dopant used is increased, the blue light emission spectrum is shifted to the right. Also, when both the third light emitting portion B1 having the single blue light emitting stack structure and the fourth light emitting portion B2 of the plural blue light emitting stack structure are included, the color gamut overlapping DCI-P3 is 100%, which means that the color gamut satisfies the requirements of DCI-P3, as in the third experimental example (Ex3) and the fifth to eighth experimental examples (Ex5a, Ex5b, Ex5c, and Ex5d).

In addition, Table 4 illustrates a lifespan based on the area ratio of the third light emitting portion B1 to the fourth light emitting portion B2 of each of the third experimental example (Ex3), the fifth experimental example (Ex5a), and the eighth experimental example (Ex5d). It is assumed that, when the area ratio of the third light emitting portion B1 to the fourth light emitting portion B2 of the third experimental example (Ex3) is 1:1, the lifespan of each of the third light emitting portion B1 to the fourth light emitting portion B2 is 1.0.

When the area of the third light emitting portion B1 is three times the area of the fourth light emitting portion B2, as in the fifth experimental example (Ex5a), the lifespan of the third light emitting portion B1 is 1.0, and the lifespan of the fourth light emitting portion B2 is 4.1 times the lifespan of the third light emitting portion B1, since the same drive current is supplied to the area of the fourth light emitting portion B2 reduced to ⅓ of the area of the third light emitting portion B1.

On the other hand, when the area of the fourth light emitting portion B2 is three times the area of the third light emitting portion B1, as in the eighth experimental example (Ex5d), the lifespan of the third light emitting portion B1 is 1.0, and the lifespan of the fourth light emitting portion B2 is 0.1 times the lifespan of the third light emitting portion B1, since the same drive current is supplied to the fourth light emitting portion B2 including two blue light emitting stacks while having an area equivalent to three times the area of the third light emitting portion B1.

When both the third light emitting portion B1 and the fourth light emitting portion B2 are provided, color purity and color gamut are improved, as shown in Table 3 and FIG. 11. When the lifespan of a specific light emitting portion is reduced, however, the lifespan of the light emitting display device depends on the lifespan characteristics of the light emitting portion having the reduced lifespan, as shown in Table 4. For this reason, it is preferable for light emitting portions that emit the same color light to have similar or identical lifespan characteristics. When the areas of the third light emitting portion B1 and the fourth light emitting portion B2 are similar or equal to each other, therefore, it can be expected that it is possible to obtain a similar lifespan improvement effect in the entirety of the light emitting display device irrespective of the lifespan characteristics of a specific light emitting portion.

TABLE 4

| Experimental example | Area ratio | | Lifespan characteristics | |
|---|---|---|---|---|
| | B1 | B2 | B1 | B2 |
| Ex3 | 1 | 1 | 1.0 | 1.0 |
| Ex5d | 1 | 3 | 1.0 | 0.1 |
| Ex5a | 3 | 1 | 1.0 | 4.1 |

However, the light emitting display device according to the present disclosure is not limited to the configuration where areas of the third light emitting portion and the fourth light emitting portion are similar or equal to each other. As illustrated by the above experiments, even though the third light emitting portion and the fourth light emitting portion are commonly provided, color purity and color gamut are improved. In addition, the area ratio of the third light emitting portion to the fourth light emitting portion can be 1:10 to 10:1. Further, the blue light emitting portion includes a single-stack blue light emitting portion and a plural-stack blue light emitting portion, the single-stack blue light emitting portion and the plural-stack blue light emitting portion commonly include a blue light emitting layer having a fluorescent dopant, and the plural-stack blue light emitting portion optionally further includes a blue light emitting layer having a phosphorescent dopant.

In this instance, the blue light emitting layer having the fluorescent dopant can improve color purity, and the blue light emitting layer having the phosphorescent dopant can improve efficiency.

Furthermore, a single stack structure including a blue light emitting layer having a fluorescent dopant and a plural stack structure in which a blue light emitting layer having a fluorescent dopant and a blue light emitting layer having a phosphorescent dopant overlap each other may be separately provided, and the area ratio of blue light emitting portions in the single stack structure and the plural stack structure may be adjusted, whereby it is possible to optimize lifespan characteristics irrespective of a specific blue light emitting portion.

In addition, a single stack structure including a blue light emitting layer having a fluorescent dopant and a plural stack structure in which a blue light emitting layer having a fluorescent dopant and a blue light emitting layer having a phosphorescent dopant overlap each other may be separately provided, whereby it is possible to reduce color deviation due to viewing angle change, compared to the case in which color deviation due to viewing angle change is great when only the single stack structure is used, only the plural stack structure is used, or the blue light emitting layer having the fluorescent dopant and the blue light emitting layer having the phosphorescent dopant overlap each other, and therefore it is possible to prevent or reduce user perception of color deviation due to viewing angle change.

Furthermore, a common stack is provided in the dual structure, whereby it is possible to simplify processes of forming the single stack structure and the plural stack structure, and therefore it is possible to obtain an advantage of process cost reduction. In addition, it is possible to obtain an environmentally friendly advantage due to process simplification.

A light emitting display device according to one or more aspects of the present disclosure includes a bank to expose first to fourth light emitting portions on a substrate, first to fourth anodes respectively at the first to fourth light emitting portions, a first light emitting stack on the first to fourth anodes, a charge generation layer and a second light emitting stack provided on the first light emitting stack to correspond to the fourth light emitting portion and a cathode on the first light emitting stack of the first to third light emitting portions and the second light emitting stack of the fourth light emitting portion.

In a light emitting display device according to one or more aspects of the present disclosure, the first to third light emitting portions respectively can include a red light emitting layer, a green light emitting layer, and a blue light emitting layer in the first light emitting stack. The fourth light emitting portion may comprise a first blue light emitting layer at a same layer as the blue light emitting layer in the first light emitting stack and a second blue light emitting layer in the second light emitting stack.

The third anode and the fourth anode can be horizontally connected to each other. Also, the first light emitting stack can include a first common layer located between the first to fourth anodes and the red light emitting layer, the green light emitting layer, the blue light emitting layer, and the first blue light emitting layer and a second common layer located on the red light emitting layer, the green light emitting layer, the blue light emitting layer, and the first blue light emitting layer. And the second light emitting stack may further comprise a hole transport function layer between the charge generation layer and the second blue light emitting layer and an electron transport function layer between the second blue light emitting layer and the cathode.

In addition, the electron transport function layer can contact the second common layer on the bank between the third light emitting portion and the fourth light emitting portion.

Further, the first common layer can include a hole injection layer, a hole transport layer, and an electron blocking layer. And each of the first light emitting portion and the second light emitting portion may further include a hole transport auxiliary layer between the hole transport layer and the electron blocking layer.

Also, the first light emitting stack at the first light emitting portion can have a largest thickness, and the first light emitting stack at the third light emitting portion and the fourth light emitting portion can have a smallest thickness among the light emitting stacks.

In addition, each of the blue light emitting layer and the first blue light emitting layer can include a fluorescent dopant, and the second light emitting layer may comprise a non-fluorescent dopant. Further, the non-fluorescent dopant can be a phosphorescent dopant or a thermally activated delayed fluorescent (TADF) dopant.

In addition, a sum of an area of the third light emitting portion and an area of the fourth light emitting portion can be greater than an area of each of the first light emitting portion and the second light emitting portion. And a ratio in area of the third light emitting portion to the fourth light emitting portion can be 1:10 to 10:1.

A light emitting display device according to one or more aspects of the present disclosure, can include a bank to expose first to fourth light emitting portions on a substrate, first to fourth anodes respectively at the first to fourth light emitting portions, a first light emitting layer on the first anode, a second light emitting layer on the second anode, and a third light emitting layer on the third anode and the fourth anode, a charge generation layer and a fourth light emitting layer sequentially on the third light emitting layer, the charge generation layer and the fourth light emitting layer not to overlap the third light emitting portion and to overlap the fourth light emitting portion and a cathode on the first light emitting layer, the second light emitting layer, and the third light emitting layer of the first to third light emitting portions and the fourth light emitting layer.

Further, each of the third light emitting layer and the fourth light emitting layer can have an emission peak at a wavelength of 420 nm to 490 nm. Also, the third light emitting layer can include a fluorescent dopant, and the fourth light emitting layer can include a non-fluorescent dopant.

The non-fluorescent dopant may be a phosphorescent dopant or a thermally activated delayed fluorescent dopant.

A light emitting display device according to one or more aspects of the present disclosure, can also include a first common layer between the first to fourth anodes and the first to third light emitting layers, a second common layer between the first to third light emitting layers and the cathode and an electron transport function layer between the fourth light emitting layer and the cathode.

Also, a lower surface of the cathode can contact the second common layer at the first to third light emitting portions, and the lower surface of the cathode can contact the electron transport function layer at the fourth light emitting portion.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting display device comprising:
   a bank exposing first to fourth light emitting portions on a substrate;

23 first to fourth anodes respectively disposed on one of the first to fourth light emitting portions;

first light emitting stacks on the first to fourth anodes;

a charge generation layer on the first light emitting stack in the fourth light emitting portion, the charge generation layer spaced apart from the first light emitting portion;

a second light emitting stack on the charge generation layer in the fourth light emitting portion; and a cathode on the first light emitting stacks and the second light emitting stacks.

2. The light emitting display device according to claim 1, wherein the first light emitting stack in the first light emitting portion includes a red light emitting layer, the first light emitting stack in the second light emitting portion includes a green light emitting layer, the first light emitting stack in the third light emitting portion includes a blue light emitting layer, the first light emitting stack in the fourth light emitting portion includes a first blue light emitting layer at a same layer as the blue light emitting layer in the first light emitting stack, and the second light emitting stack in the fourth light emitting portion includes a second blue light emitting layer.

3. The light emitting display device according to claim 2, wherein the third anode and the fourth anode are integrally formed, and are provided in the same layer, and are horizontally connected to each other.

4. The light emitting display device according to claim 2, further comprising:

a first common layer located between the first to fourth anodes and the first light emitting stacks;

a second common layer located on the red light emitting layer, the green light emitting layer, the blue light emitting layer, and the first blue light emitting layer; and an electron blocking layer located between the first common layer and the red light emitting layer, the green light emitting layer, the blue light emitting layer, and the first blue light emitting layer.

5. The light emitting display device according to claim 4, wherein the second light emitting stack in the fourth light emitting portion further comprises a hole transport layer between the charge generation layer and the second blue light emitting layer, and an electron transport layer between the second blue light emitting layer and the cathode.

6. The light emitting display device according to claim 5, wherein the electron transport layer contacts the second common layer on the bank between the third light emitting portion and the fourth light emitting portion.

7. The light emitting display device according to claim 5, wherein the first common layer comprises at least one of a hole injection layer, a hole transport layer, and an electron blocking layer, and the first light emitting portion and the second light emitting portion further comprises at least one a hole transport auxiliary layer between the first common layer and the electron blocking layer.

8. The light emitting display device according to claim 1, wherein the first light emitting stack at the first light emitting portion has a larger thickness than the first light emitting stack at the second light emitting portion, and the first light emitting stack at the third light emitting portion and the fourth light emitting portion has a smaller thickness than the first light emitting stack at the first light emitting portion and the second light emitting portion.

9. The light emitting display device according to claim 2, wherein at least one of the blue light emitting layer in the third light emitting portion and the first blue light emitting layer in the fourth light emitting portion comprises a fluorescent dopant, and the second blue light emitting layer of the second light emitting stack comprises a non-fluorescent dopant.

10. The light emitting display device according to claim 9, wherein the non-fluorescent dopant is a phosphorescent dopant or a thermally activated delayed fluorescent (TADF) dopant.

11. The light emitting display device according to claim 1, wherein a sum of an area of the third light emitting portion and an area of the fourth light emitting portion is greater than an area of each of the first light emitting portion and the second light emitting portion, and a ratio in an area of the third light emitting portion to an area of the fourth light emitting portion is 1:10 to 10:1.

12. A light emitting display device comprising:

a bank exposing first to fourth light emitting portions;

first to fourth anodes respectively disposed on one of the first to fourth light emitting portions;

a first light emitting layer on the first anode, a second light emitting layer on the second anode, and a third light emitting layer on both the third anode and the fourth anode;

a charge generation layer and a fourth light emitting layer stacked one on the other on the third light emitting layer in the fourth light emitting portion, the charge generation layer and the fourth light emitting layer exposing the third light emitting portion; and a cathode on the first light emitting layer, the second light emitting layer, and the third light emitting layer in the first to third light emitting portions and on the fourth light emitting layer in the fourth light emitting portion.

13. The light emitting display device according to claim 12, wherein each of the third light emitting layer and the fourth light emitting layer has an emission peak at a wavelength in a range of 420 nm to 490 nm.

14. The light emitting display device according to claim 13, wherein one of the third light emitting layer and the fourth light emitting layer comprises a fluorescent dopant, and the other of the third light emitting layer and the fourth light emitting layer comprises a non-fluorescent dopant.

15. The light emitting display device according to claim 12, further comprising:

a first common layer between the first to fourth anodes and the first to third light emitting layers;

a second common layer between the first to third light emitting layers and the cathode; and an electron transport layer between the fourth light emitting layer and the cathode.

16. The light emitting display device according to claim 15, wherein a lower surface of the cathode contacts the second common layer in the first to third light emitting portions, and the lower surface of the cathode contacts the electron transport layer in the fourth light emitting portion.

17. A light emitting display device comprising:

a substrate;

a first anode on the substrate in a first light emitting portion;

a second anode on the substrate in a second light emitting portion;

a third anode on the substrate in a third light emitting portion;

a fourth anode on the substrate in a fourth light emitting portion;

a first common layer commonly provided on the first anode, the second anode, the third anode and the fourth anode;

a first light emitting layer in the first light emitting portion on the first common layer;

a second light emitting layer in the second light emitting portion on the first common layer;

a third light emitting layer in the third and fourth light emitting portions on the first common layer;

a second common layer commonly provided on the first light emitting layer, the second light emitting layer and the third light emitting layer;

a charge generation layer on the third light emitting layer in the fourth light emitting portion on the second common layer;

a fourth light emitting layer on the charge generation layer in the fourth light emitting portion; and a cathode on the second common layer in the first, second and third light emitting portions and on the fourth light emitting layer in the fourth light emitting portion.

18. The light emitting display device according to claim 17, wherein the first light emitting layer includes a red light emitting layer, the second light emitting layer includes a green light emitting layer, and the third light emitting layer includes a first blue light emitting layer, and the fourth emitting layer includes a second blue light emitting layer, and wherein the first blue light emitting layer and the second blue light emitting layer are made of different materials and are configured to emit at different wavelengths.

19. The light emitting display device according to claim 18, wherein the third anode and the fourth anode are arranged in the same layer, and are in the same horizontal plane, and are integrally formed, and are connected to each other.

20. The light emitting display device according to claim 18, further comprising:

a hole transport layer on the charge generation layer in the fourth light emitting portion;

a second blue light emitting layer on the hole transport layer; and an electron transport layer provided on the second blue light emitting layer.

\* \* \* \* \*